US012772513B2

(12) United States Patent
Kao et al.

(10) Patent No.: US 12,772,513 B2
(45) Date of Patent: Oct. 20, 2026

(54) SEMICONDUCTOR DEVICE WITH IMPROVED SOURCE/DRAIN PROFILE AND METHODS OF FABRICATION THEREOF

(71) Applicant: TAIWAN SEMICONDUCTOR MANUFACTURING COMPANY, LTD., Hsinchu (TW)

(72) Inventors: Kuei-Yu Kao, Hsinchu (TW); Shih-Yao Lin, New Taipei City (TW); Chiung-Yu Cho, Hsinchu (TW); Chen-Ping Chen, Yilan County (TW); Chih-Han Lin, Hsinchu (TW); Ming-Ching Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 598 days.

(21) Appl. No.: 18/222,077

(22) Filed: Jul. 14, 2023

(65) Prior Publication Data

US 2025/0022914 A1 Jan. 16, 2025

(51) Int. Cl.

*H01L 29/06* (2006.01)
*H01L 21/8234* (2006.01)
(Continued)

(52) U.S. Cl.

CPC ......... *H10D 62/121* (2025.01); *H10D 30/014* (2025.01); *H10D 30/43* (2025.01);
(Continued)

(58) Field of Classification Search

CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/797; H10D 62/021; H10D 62/118; H10D 62/119; H10D 62/121; H10D 62/149; H10D 62/151; H10D 64/015; H10D 64/017; H10D 64/018; H10D 64/021; H10D 84/017; H10D 84/0147; H10D 84/0158; H10D 84/0193;
(Continued)

(56) References Cited

U.S. PATENT DOCUMENTS

| | | | |
|---|---|---|---|
| 9,093,530 | B2 | 7/2015 | Huang et al. |
| 9,171,929 | B2 | 10/2015 | Lee et al. |

(Continued)

FOREIGN PATENT DOCUMENTS

| | | | |
|---|---|---|---|
| CN | 110931430 | A | 3/2020 |
| TW | 202127664 | A | 7/2021 |

(Continued)

*Primary Examiner* — David C Spalla

(74) *Attorney, Agent, or Firm* — NZ Carr Law Office

(57) ABSTRACT

A method of forming a nanosheet FET is provided. A plurality of first and second semiconductor layers are alternately formed on a substrate. The first and second semiconductor layers are patterned into a plurality of stacks of semiconductor layers separate from each other by a space along a direction. Each stack of semiconductor layers has a cross-sectional view along the direction gradually widening towards the substrate. An epitaxial feature is formed in each of the spaces. The patterned second semiconductor layers are then removed from each of the stacks of semiconductor layers.

20 Claims, 20 Drawing Sheets

(51) Int. Cl.

| | |
|---|---|
| ***H01L 27/088*** | (2006.01) |
| ***H01L 29/08*** | (2006.01) |
| ***H01L 29/423*** | (2006.01) |
| ***H01L 29/66*** | (2006.01) |
| ***H01L 29/775*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |

(52) U.S. Cl.
CPC ....... *H10D 30/6735* (2025.01); *H10D 62/151* (2025.01); *H10D 64/017* (2025.01); *H10D 84/013* (2025.01); *H10D 84/0147* (2025.01); *H10D 84/038* (2025.01); *H10D 84/83* (2025.01)

(58) Field of Classification Search
CPC .... H10D 84/038; H10D 84/83; H10D 84/834; H10D 84/853
See application file for complete search history.

(56) References Cited

U.S. PATENT DOCUMENTS

| | | | | |
|---|---|---|---|---|
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 11,424,347 | B2 | 8/2022 | Liao et al. | |
| 2021/0098627 | A1 * | 4/2021 | Liaw | H10D 30/43 |
| 2021/0249413 | A1 * | 8/2021 | Noh | H10D 62/121 |
| 2022/0359678 | A1 * | 11/2022 | Kim | H10D 84/038 |
| 2023/0059169 | A1 * | 2/2023 | Kim | H10D 84/0193 |

FOREIGN PATENT DOCUMENTS

| | | | |
|---|---|---|---|
| TW | 202303971 | A | 1/2023 |
| TW | 202310409 | A | 3/2023 |

* cited by examiner

SEMICONDUCTOR DEVICE WITH IMPROVED SOURCE/DRAIN PROFILE AND METHODS OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to achieve increased device density, greater carrier mobility and drive current in a device. As device size reduces, there is a continuous need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
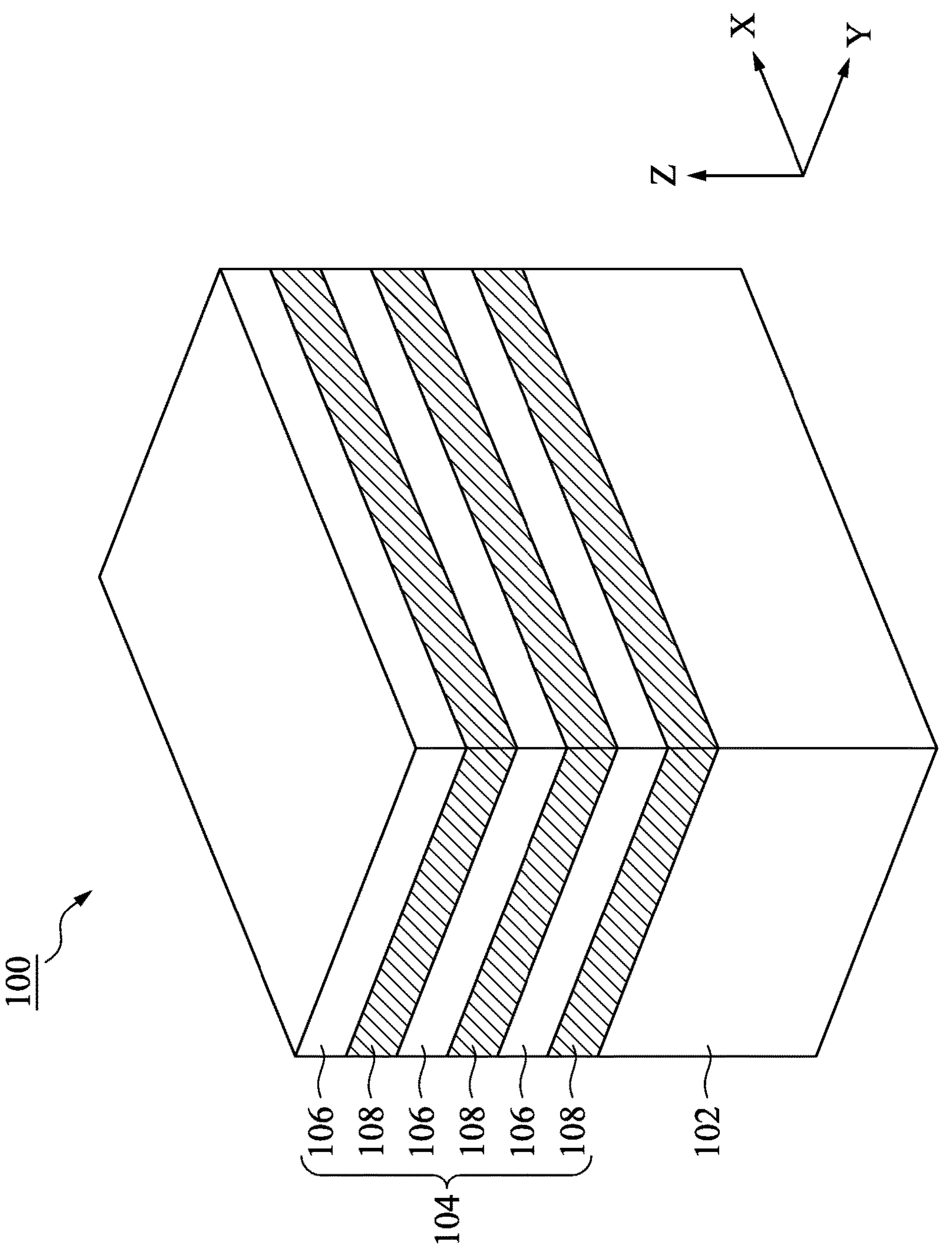
FIGS. 1-4, 5A-5C, 8A-8C, and 9A-9C are cross-sectional views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The integration of gate-all-around (GAA) nanosheet FETs involves with a series of steps such as formation of stacked nanosheet, fin reveal and STI formation, dummy gate formation, inner spacer and junction formation in which source/drain (S/D) epitaxy layers are selectively formed on either side of exposed nanosheet ends, and replacement metal gate formation. In an N2/N3/N4/N5 nanosheet device, the reduction of channel resistance ($R_{ch}$) leads to enhancement of electric current I and improves the device yield. The geometry or profile of the channels; and consequently, the geometry of the S/D region, plays an important role to determine the value of $R_{ch}$. For example, the shape of the S/D region may affect the distance and depth of epitaxy growth the neighboring pair of channels. The longer distance between the channels and shallower depth of epitaxy growth may cause $R_{ch}$ to increase. The shape of the defined space for forming the S/D regions may also cause incomplete epitaxy growth that further increases the channel resistance $R_{ch}$. As a result, a lower value of I can be expected. Detailed description of a nanosheet device with improved channel and S/D profiles in a nanosheet device is provided with references to the drawings as follows.

While the embodiments of this disclosure are discussed with respect to nanosheet FETs, implementations of some aspects of the present disclosure may be used in other processes and/or in other devices, such as planar FETs, FinFETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1 to 5C and 8A to 9C show exemplary processes for manufacturing a semiconductor device structure 100 according to embodiments of the present disclosure. It is understood that additional operations can be provided before, during, and after processes shown by FIGS. 1 to 5C and 8A to 9C, and some of the operations described below can be replaced or eliminated, for additional embodiments of the method. The order of the operations/processes is not limiting and may be interchangeable.

FIGS. 1 to 5C and 8A to 9C are cross-sectional views of various stages of manufacturing a semiconductor device structure 100 along an X-Z plane in accordance with some embodiments. As shown in FIG. 1, the semiconductor device structure 100 includes a stack of semiconductor layers 104 formed over a substrate 102. The substrate 102 may be a semiconductor substrate. The substrate 102 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 102 is made of silicon. In some embodiments, the substrate 102 is a silicon-on-insulator (SOI) substrate having an insulating layer (not shown) disposed between two silicon layers for enhancement. In one aspect, the insulating layer is an oxygen-containing layer.

The substrate 102 may include various regions that have been doped with impurities (e.g., dopants having p-type or n-type impurities). Depending on circuit design, the dopants may be, for example boron for p-type field effect transistors (p-type FETs) and phosphorus for n-type field effect transistors (n-type FETs).

The stack of semiconductor layers 104 includes semiconductor layers made of different materials to facilitate formation of nanosheet channels in a multi-gate device, such as nanosheet FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108, and the first and second semiconductor layers 106, 108 are disposed parallelly with each other. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some embodiments, the first semiconductor layers 106 may be made of SiGe having a first Ge concentration range, and the second semiconductor layers 108 may be made of SiGe having a second Ge concentration range that is lower or greater than the first Ge concentration range. In any case, the second semiconductor layers 108 may have a Ge concentration in a range between about 20% and 30%.

The thickness of the first semiconductor layers 106 and the second semiconductor layers 108 may vary depending on the application and/or device performance considerations. In some embodiments, each first and second semiconductor layer 106, 108 may have a thickness in a range between about 5 nm and about 30 nm. Each second semiconductor layer 108 may have a thickness that is equal to, less than, or greater than the thickness of the first semiconductor layer 106. In some embodiments, each first semiconductor layer 106 has a thickness in a range between about 10 nm and about 30 nm, and each second semiconductor layer 108 has a thickness in a range between about 5 nm to about 20 nm. The second semiconductor layers 108 may eventually be removed and serve to define a vertical distance between adjacent channels for the semiconductor device structure 100.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels for each FET. For example, the number of first semiconductor layers 106, which is the number of channels, may be between 2 and 8.

Figure 2:
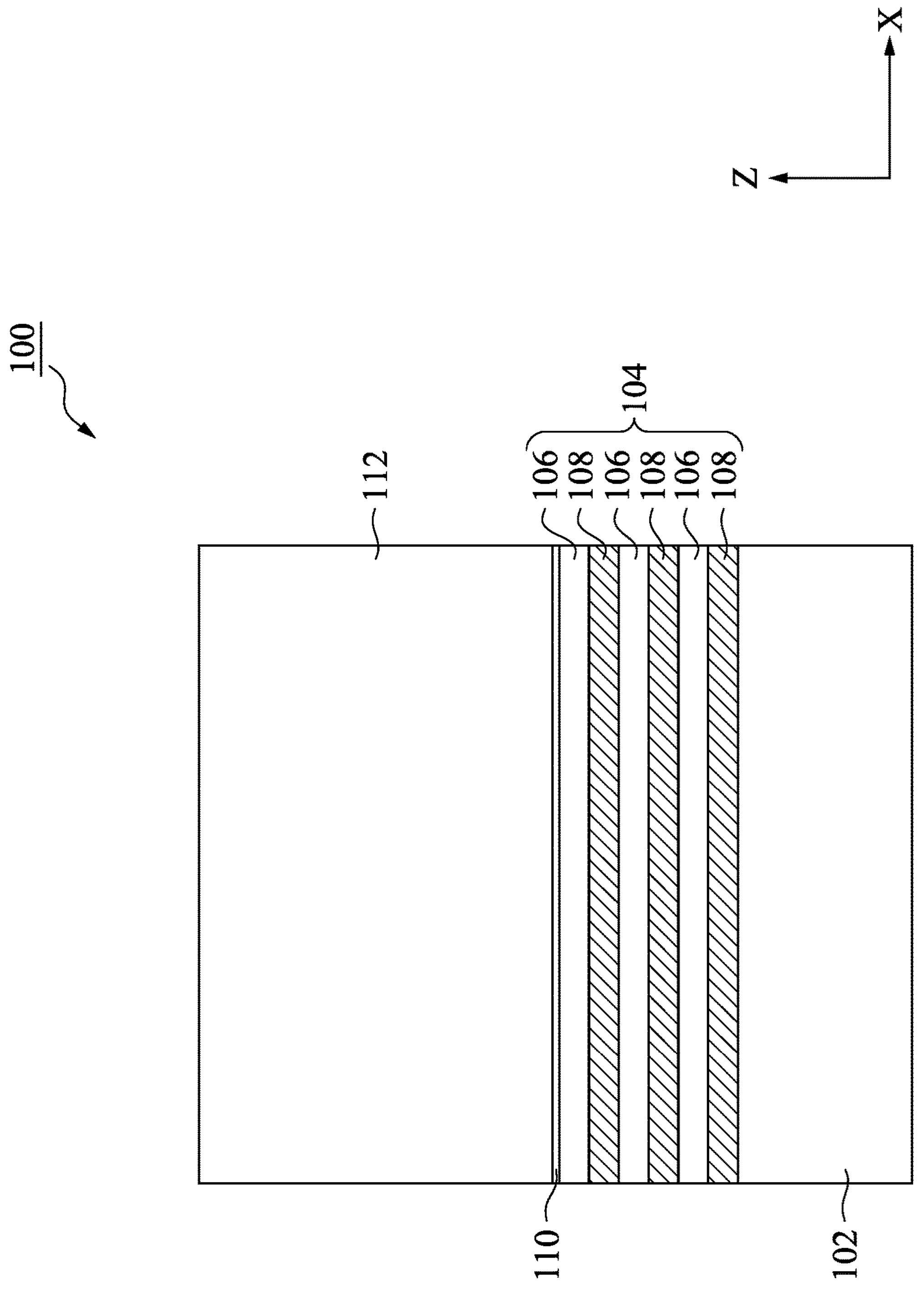

In FIG. 2, an etch stop layer 110 is formed on the stack of semiconductor layers 104, and a sacrificial (dummy) gate layer 112 is deposited on the etch stop layer 110. The sacrificial gate layer 112 may include sacrificial gate dielectric layer, a sacrificial gate electrode layer, and a mask layer formed by sequentially depositing blanket layers of the sacrificial gate dielectric material, the sacrificial gate electrode material, and the mask layer, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

Figure 3:
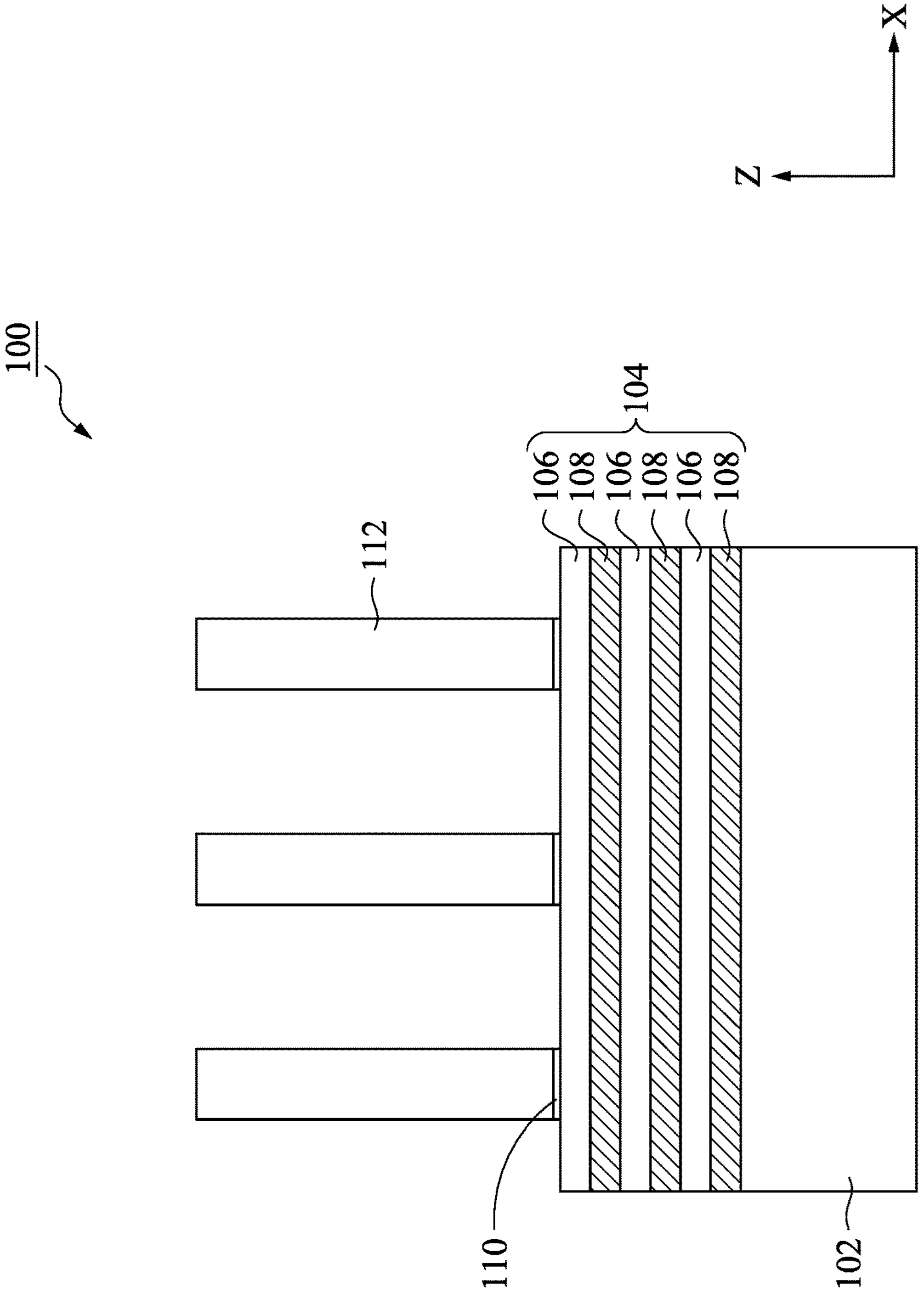

After patterning the sacrificial gate layer into a plurality of sacrificial gate structures 112, the etch stop layer 110 exposed between the neighboring sacrificial gate structures 112 is removed to expose portions of the stack of semiconductor layers 104 as shown in FIG. 3. The portions of the stack of semiconductor layers 104 covered by the sacrificial gate structure 112 may serve as channels for the semiconductor device structure 100 in the subsequent process, while the exposed portions of the stack of semiconductor layers 104 may be removed to define source/drain (S/D) regions, which will be discussed in detail as follows. In FIG. 3, three sacrificial gate structures 112 are shown. It is appreciated that more sacrificial gate structures 112 may be arranged along the X direction in some embodiments.

Figure 4:
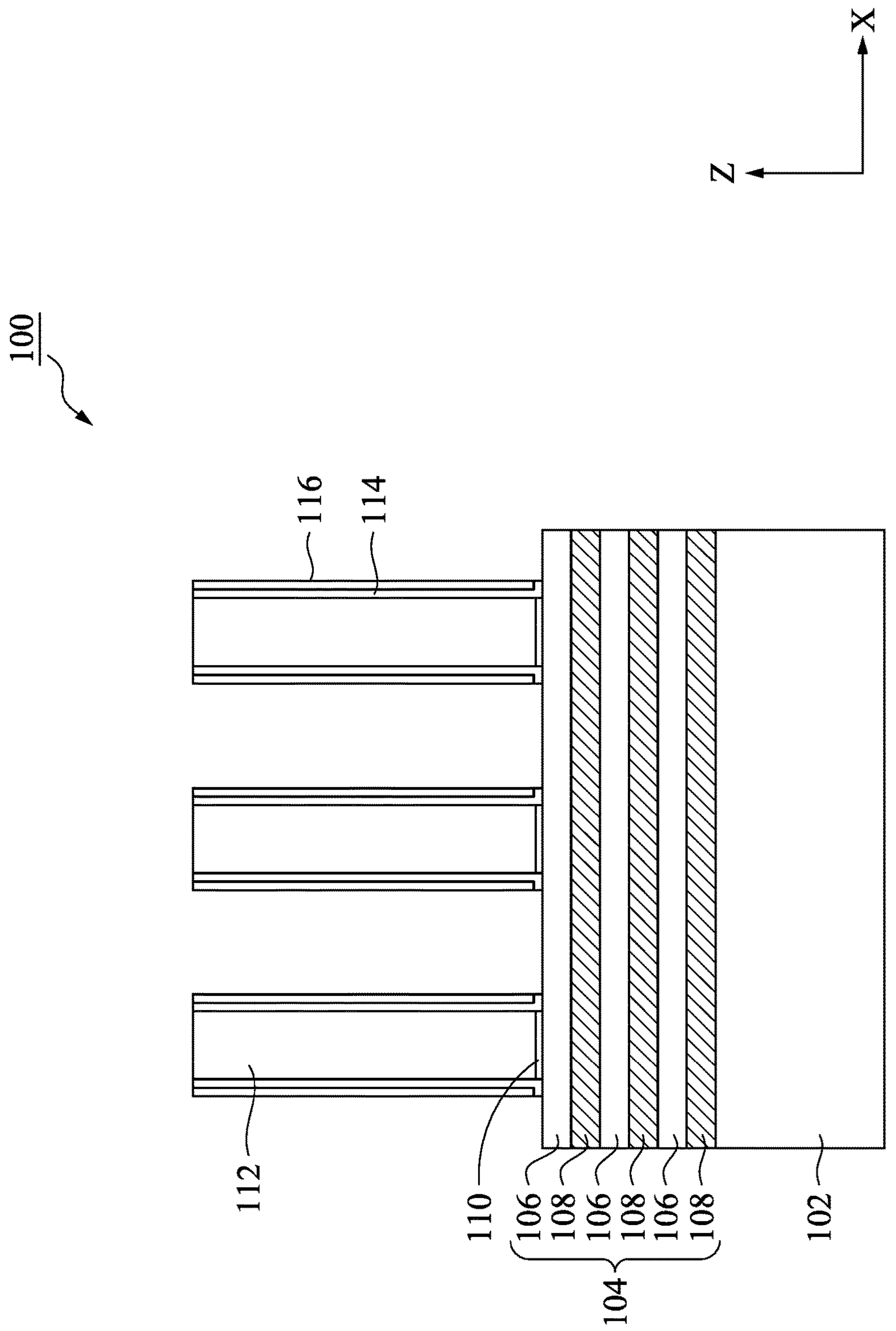

FIG. 4 shows the formation of gate spacers, which may include a single layer or multiple layers conformally deposited on the exposed surfaces, including the sidewalls of the sacrificial gate structures 112 and the top surfaces of the substrate 102 between the neighboring sacrificial gate structures 112. An anisotropic process, for example, RIE, is performed to remove the conformal layers on the horizontal surfaces, including the top surfaces of sacrificial gate structure 112 and the surfaces in contact with the stack of semiconductor layers 104, while leaving the conformal layers deposited on the sidewalls of the sacrificial gate structures 112. In the embodiment as shown in FIG. 4, the gate spacers include a spacer layer 114 and a spacer layer 116. Each of the spacer layers 114 and 116 may be formed from materials such as silicon oxide, silicon nitride, silicon carbide, silicon oxynitride, SiCN, silicon oxycarbide, SiOCN, and/or combinations thereof, or other similar materials, by an ALD process or other suitable processes.

Figure 5A:
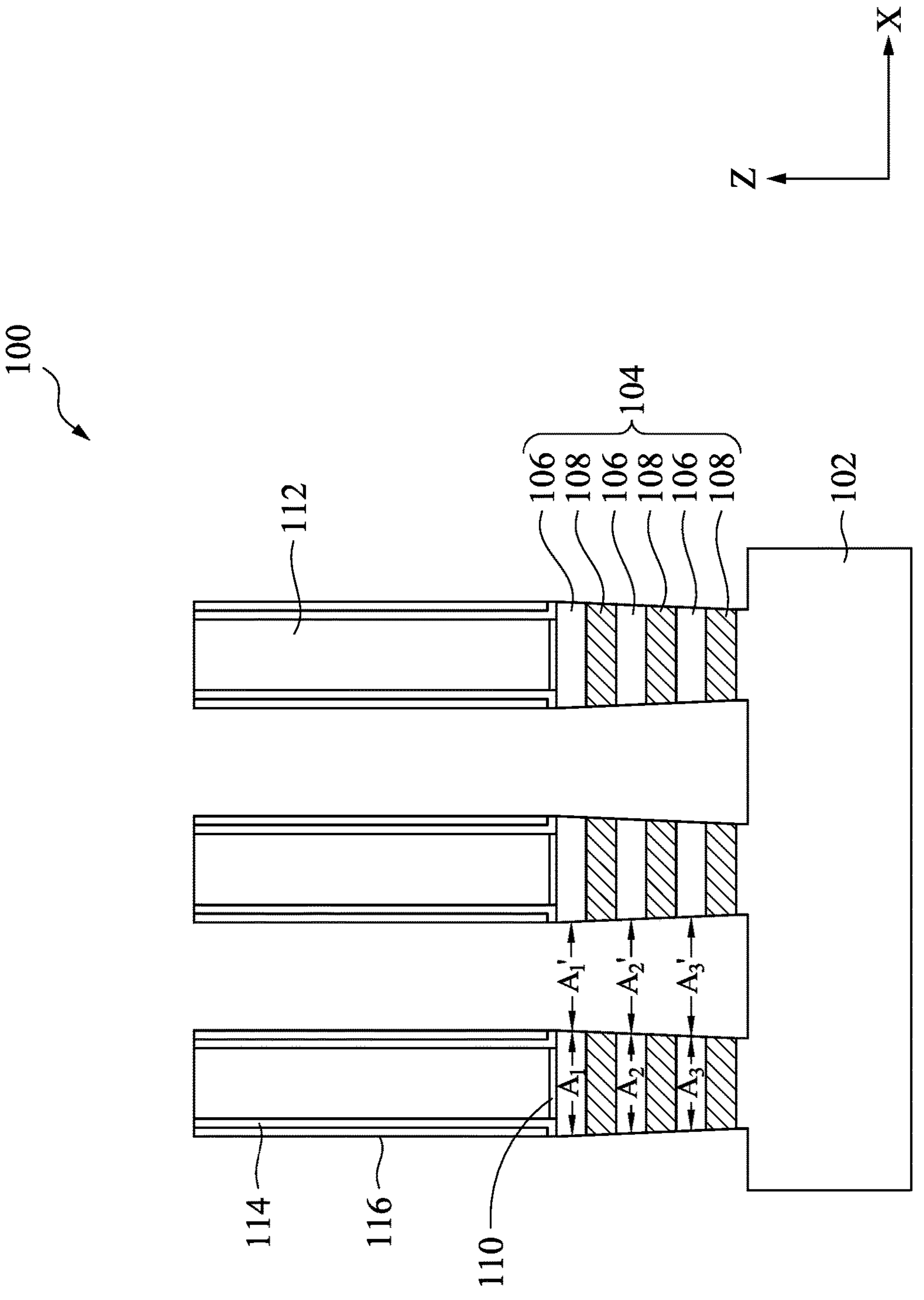
Figure 5B:
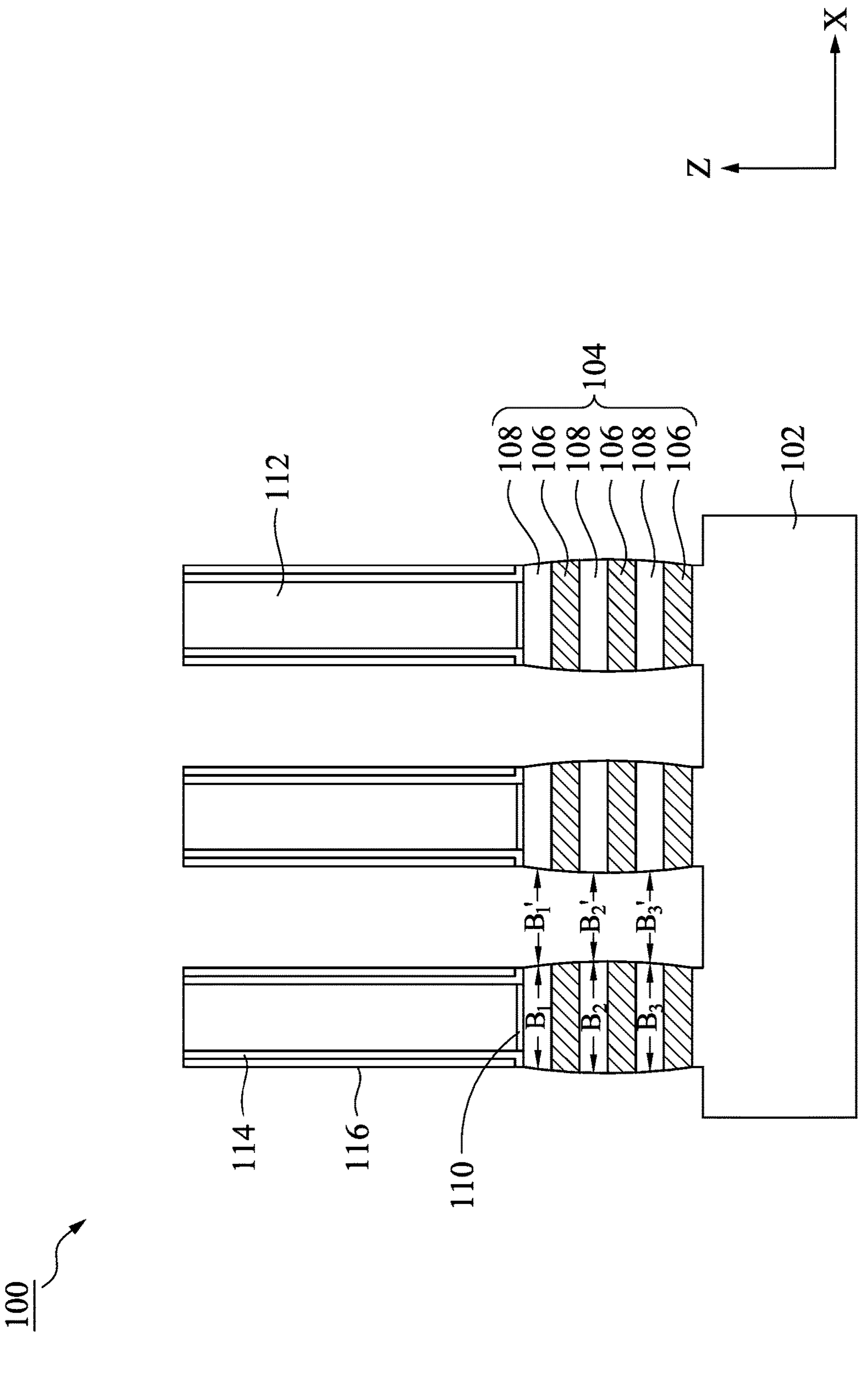
Figure 5C:
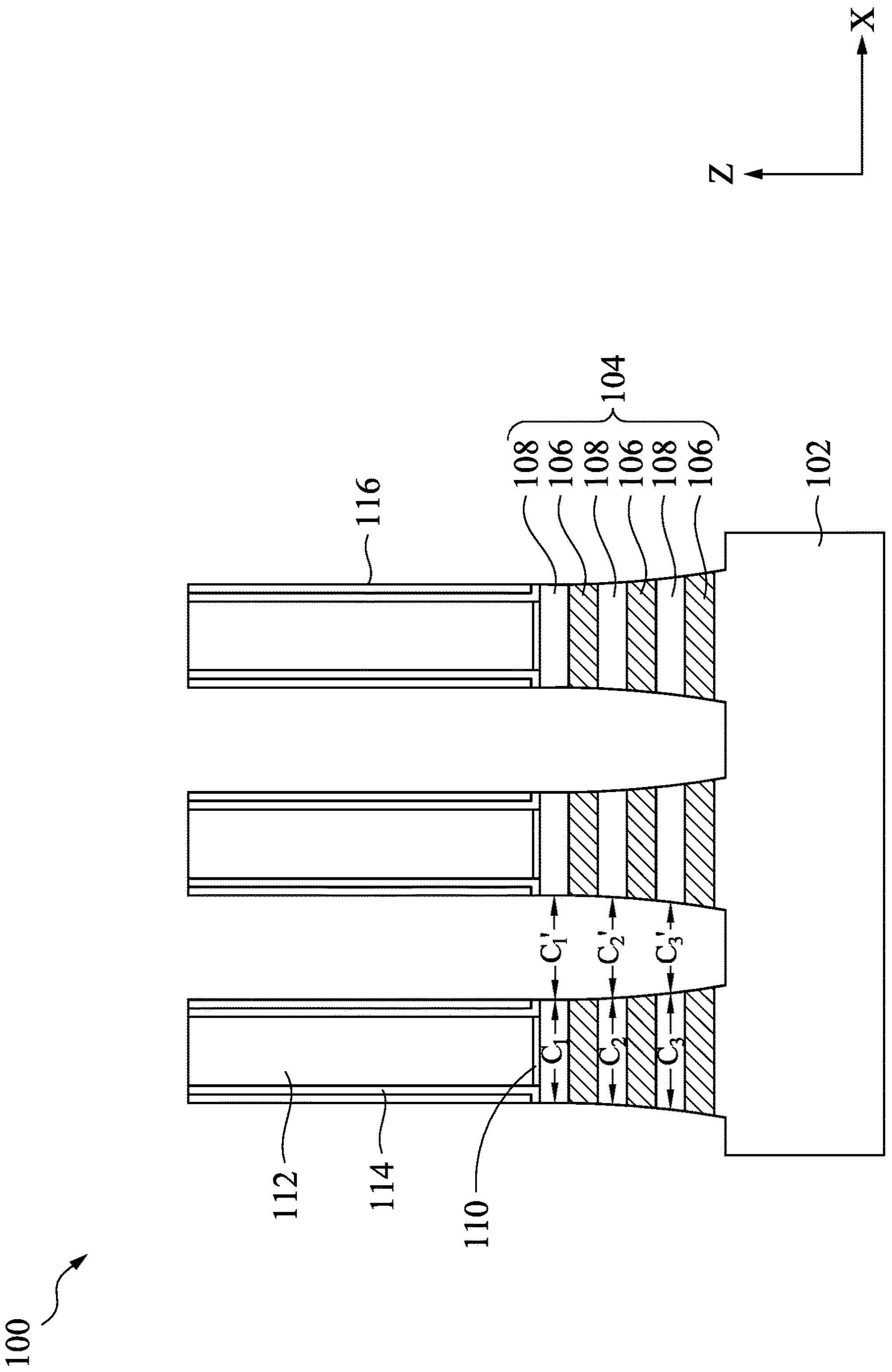

In FIGS. 5A-5C, exposed portions of the stack of semiconductor layers 104 are removed until the underlying substrate 102 is exposed. In some embodiments, exposed portions of the stack of semiconductor layers 104 are removed to expose portions of the substrate 102 underlying the stack of semiconductor layers 104. In the embodiment as shown in FIGS. 5A-5C, the exposed portions of the substrate 102 between the neighboring stack of semiconductor layers 104 may also be removed to result in a recessed top surface slightly below the contact surface between the substrate 102 and the bottommost layer (e.g., second semiconductor layer 108) of the stack of semiconductor layers 104. The process of removing the exposed portions of the stack of semiconductor layers 104 defines the source/drain regions. According to some embodiments, the portion of the stack of semiconductor layers 104 may be removed by an anisotropic dry etch, for example, an anisotropic plasma etch. The etching process determines the profiles of the S/D region and the channels (nanosheets) to be formed in the subsequent steps. For example, the dry etch may include a plasma etch using an etching gas such as $CHF_3$, HBr, or a combination thereof. Dilute gas of He, Ar, $N_2$ or $O_2$ may be used as the passivation gas for improving selectivity during the etch process. The etching power may be controlled at about 10 W to about 4000 W. The etching pressure may be adjusted from about 1 mTorr to about 800 mTorr. The gas flow rate may be about 20 sccm to about 3000 sccm.

Figure 6:
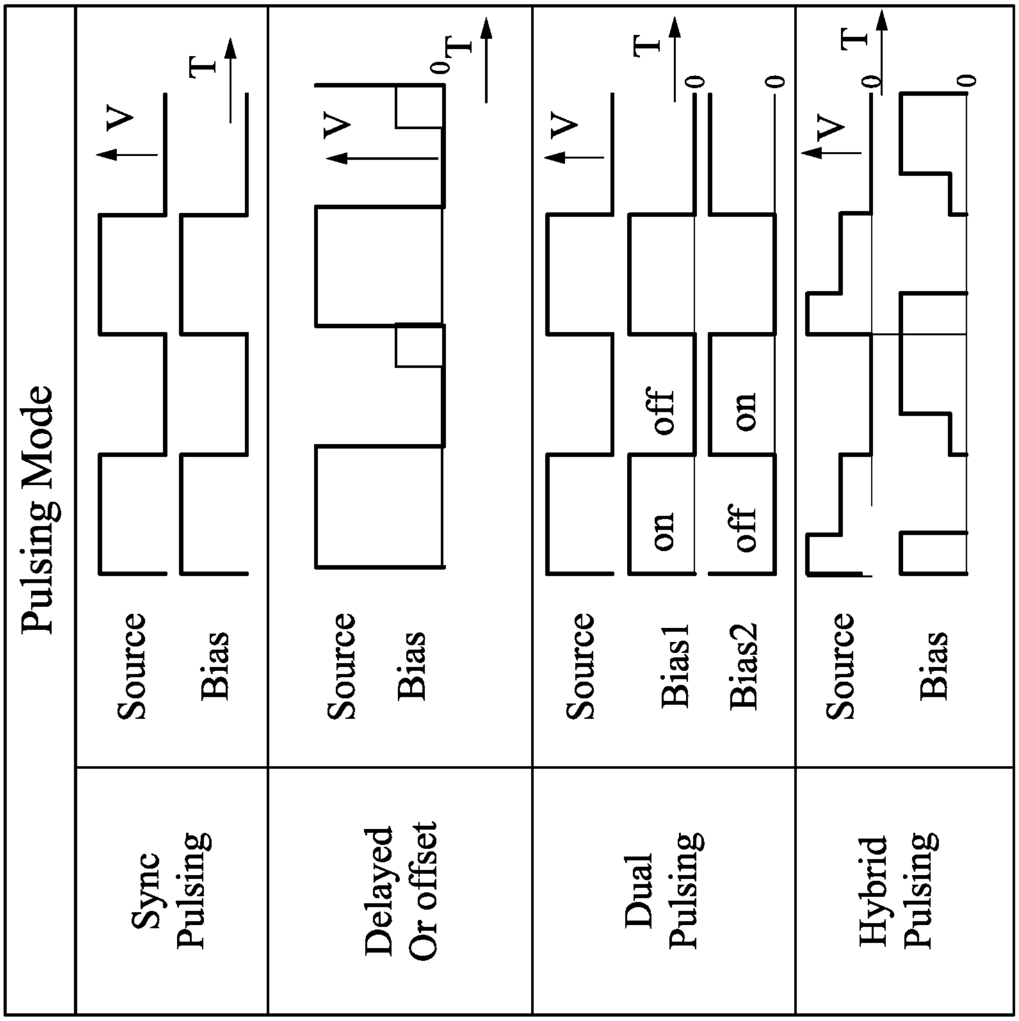
FIG. 6 shows various exemplary pulsing schemes used for etching process in accordance with some embodiments.

As discussed above, the geometries or profiles of the S/D regions and nanosheet channels to be formed subsequently may determine the value of channel resistance $R_{ch}$, and thus determine the performance of the nanosheet device 100. According to some embodiments, an anisotropic plasma etch that uses a reactive plasma to remove material from a surface is used to etch the stack of semiconductor layers 104 with a desired profile. In the anisotropic plasma etch, the plasma is generated by applying a high voltage to break down molecules of the etching gas into the constituent atoms and then ionizes the atoms. When the ionized atoms, that is, the ions, contact the material on the surface, the material is removed from the surface. During the etching process, a bias power (Bias) may also be applied to push the ions towards a desired direction, for example, vertically downwards or downwards with an inclined angle. FIG. 6 shows various pulsing schemes that may be used to perform the anisotropic plasma etch and to define the S/D region with different profiles. For example, in a synchronous pulsing scheme, a source power (Source) for creating plasma and ions and a bias power (Bias) that may control the action of the ions are synchronously switched on and off. In a delayed or offset scheme, the on/off status of the source power and bias power are offset or delayed from one to the other. In a dual pulsing scheme, one source power and two bias powers, including Bias1 and Bias2 are provided. However, the first bias power (Bias1) and the second bias power (Bias2) are not simultaneously on or off at any time of the etching process. That is, only one of the bias powers (Bias1 and Bias2) will be on at once. Therefore, although three powers may be provided, it is still a dual pulsing mode since only two powers, including the source power and either one of the bias powers may be on at the same time. In a hybrid pulsing scheme, two powers, including the source power and the bias power are used. However, at each pulsing period, the source power and the bias power may be both on, on and off, off and on, or both off.

By selecting the appropriate pulsing scheme, the S/D region may be defined with a profile as desired. For example, the profiles as shown in FIG. 5A may be formed by selecting the dual pulsing scheme, the hybrid pulsing scheme, or a combination of these two pulsing schemes. The profile of S/D region as shown in FIG. 5B may be defined by selecting the synchronous scheme, the delayed scheme, or a combination of these two schemes The synchronous pulsing scheme, the delayed pulsing scheme, and the hybrid pulsing scheme may be performed with a source power of about 150 W to about 1500 W at 26 MHz and a bias power of about 90 W to about 900 W at about 13 MHZ. The dual pulsing scheme may be performed with a source power of about 150 W to about 1500 W at 26 MHz, a first bias power of about 90 W to about 900 W at 13 MHZ, and a second bias power of about 10 W to about 150 W at 4000 kHz. In FIG. 5A, the width $A_1$ of the top first semiconductor layer 106 is broader than the width $A_2$ of the middle first semiconductor layer 106, and the width $A_2$ of the middle first semiconductor layer 106 is wider than the width $A_3$ of the bottom first semiconductor layer 106. That is, $A_1>A_2>A_3$. Consequently, the top portion of the space defining the S/D region between the neighboring first semiconductor layers 106 has a width $A_1'$ wider than the width $A_2'$ of the middle portion of the space, and the width of the middle portion of the space $A_2'$ is wider than the width $A_3'$ of the bottom portion of the space. That is, $A_1'<A_2'<A_3'$. In FIG. 5B, the width $B_2$ of the middle first semiconductor layer 106 is wider than the width $B_3$ of the bottom first semiconductor layer 106, while the width $B_3'$ of the space between the neighboring stack of semiconductor layers 104 is narrower than the width $B_2'$ of the middle portion of the space. The widths $B_2$ and $B_2'$ may be roughly the same as $B_1$ and $B_1'$, respectively. That is, $B_3<B_1\sim B_2$ and $B_3'>B_1'\sim B_2'$. The difference between the $A_1$ and $A_3$ and the difference between $B_3$ and $B_1$ may range from about 5 nm to about 10 nm. Similarly, the difference between $A_1'$ and $A_3'$ and between $B_3'$ and $B_1'/B_2'$ may range from about 10 nm to about 5 nm.

Figure 7B:
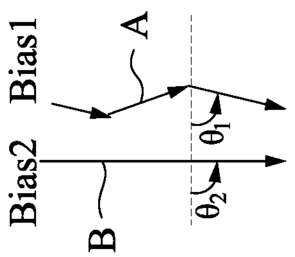
FIG. 7B shows an exemplary movement of the ions by a pulsing scheme, in accordance with some embodiments.
Figure 7A:
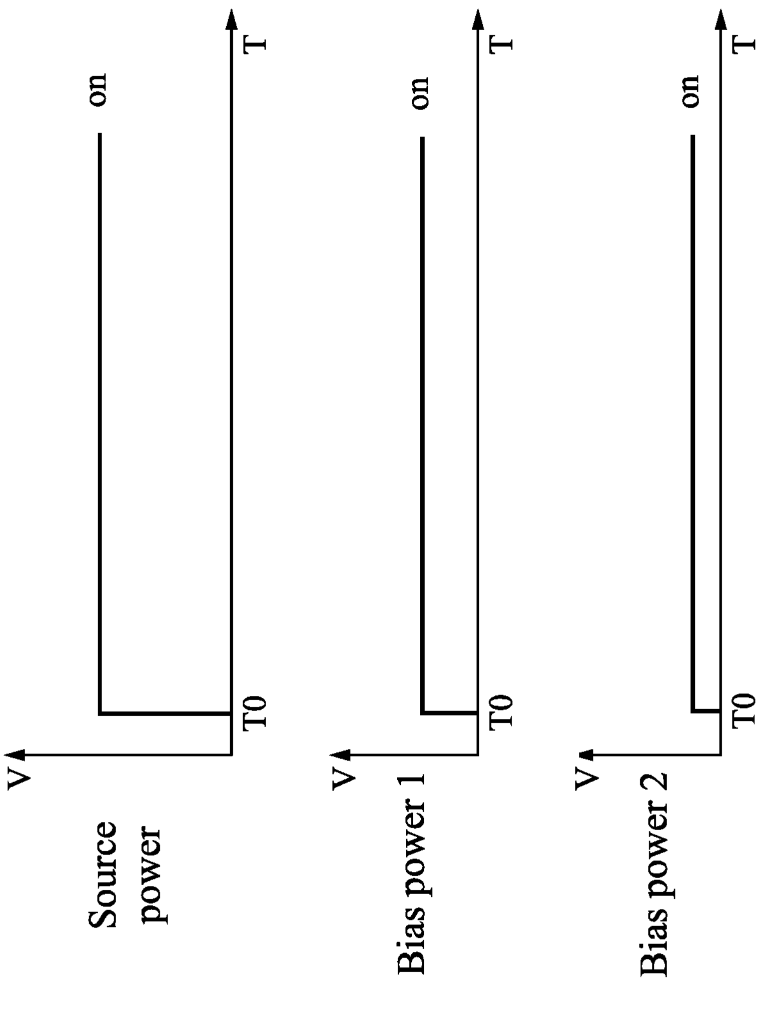
FIG. 7A shows an exemplary pulsing scheme used for etching process in accordance with some embodiments.

FIG. 5C shows the profiles of the nanosheets and the S/D regions to be formed subsequently using a different pulsing mode according to some embodiments. To form the profiles as shown in FIG. 5C, a pulsing scheme with applications of three pulsing powers, including a source power (Source), a first bias power (Bias1), and a second bias power (Bias2) at the same time is selected. For example, as shown in FIG. 7A, three generators, including a source power generator, a first bias power generator, and a second bias power generator are turned on at the same time to supply the source power, the first bias power, and the second bias power simultaneously during certain stages of the etching process. For example, Source, Bias1, and Bias2 are simultaneously and continuously on in the later stage (e.g., at $T_0$) of the etching process for removing the bottom portion of the stack of semiconductor layers 104. As discussed above, the source power creates the ions that may remove the stack of semiconductor layers 104 in contact therewith. The bias powers Bias1 and Bias2 are applied to push the ions along specific directions. For example, the second bias power with a lower frequency tends to push the ions more vertically than the first bias power with a higher frequency. For example, to form the profile as shown in FIG. 5C, the first bias power Bias1 having a frequency of about 13 MHz and the second bias power Bias 2 having a frequency of about 2,400 KHz or 1.2 MHz may be applied to control the movement of the ions towards the stack of semiconductor layers 104. The first bias power Bias1 at 13 MHz may be used to push the ions "A" flowing downward at an ion angle $\theta_1$ of about 70° to about 80° with respect to a horizontal line as shown in FIG. 7B. The second bias power Bias2 having a frequency of about 2,400 KHz or 1.2 MHz may be used to push the ions "B" flowing downward at an ion angle $\theta_2$ of about 90° with respect to the horizontal line. By controlling the powers of the Bias1 and the Bias2 allows the stack of semiconductor layers 104 to be etched with a taper profile as shown in FIG. 5C.

According to some embodiments, to avoid the sidewalls of the bottom portion of the stack of semiconductor layers 104 to be etched too deeply, that is, to avoid excessive lateral action of the ions, the first bias power Bias1 is no larger than about 200 W. To avoid over etch of the substrate, the maximum second bias power is no higher than 50 W. In some embodiment, the source power is about 150 w to about 1500 W at 26 MHz, the first bias power is about 90 W to about 200 W at 13 MHz, while the second bias power is about 10 W to about 50 W at about 400 KHz or 1.2 MHz. As shown in FIG. 7A, the source power (Source), the first bias power (Bias1), and the second bias power Bias2 are always on at certain etching stage, for example, when the etching process is performed on the lower portion of the stack of semiconductor layers 104, none of the source power Source, the first bias power Bias1, or the second bias power Bias2 is periodically off. As there is no cleaning or vacuum operation throughout such etching stage, the extra gas and byproducts created during the etching process will not be pumped out and are eventually deposited at a bottom portion of the stack of semiconductor layers 104. The additional protection by the deposited byproducts further ensures a wider bottom of the stack of semiconductor layers 104 after performing the etching process. In some embodiments, the pulsing scheme as shown in FIG. 74 may be applied to certain stages of the etching process, for example, the removal of the bottom portion of the stack of semiconductor layers 104, while other stages of the etching process, for example, the removal of the upper portion of the stack of semiconductor layers 104, may be performed by using other pulsing schemes, for example, any one or more of the pulsing schemes as shown in FIG. 6.

A taper profile, that is, a gradually increasing width from the top to the bottom, of the nanosheet as shown in FIG. 5C may thus be formed. As shown in FIG. 5C, the width $C_3$ of the bottom first semiconductor layer 106 is larger than the width $C_2$ of the middle first semiconductor layer 106, and the $C_2$ is wider than the width $C_1$ of the top first semiconductor layer 106. That is, $C_3>C_2>C_1$. Consequently, the width $C_3'$ of the bottom portion of the space for forming the S/D regions in the subsequent processing steps is smaller than the width $C_2'$ of the middle portion of the space, and $C_2'$ is smaller than the width $C_1'$ of the portion of the space. That is, $C_3'<C_2'<C_1'$. According to some embodiments, the differences between $C_3$ and $C_1$ may range from about 5 nm to about 10 nm, while the difference between $C_3'$ and $C_1'$ may range from 10 nm to about 5 nm.

Figure 8A:
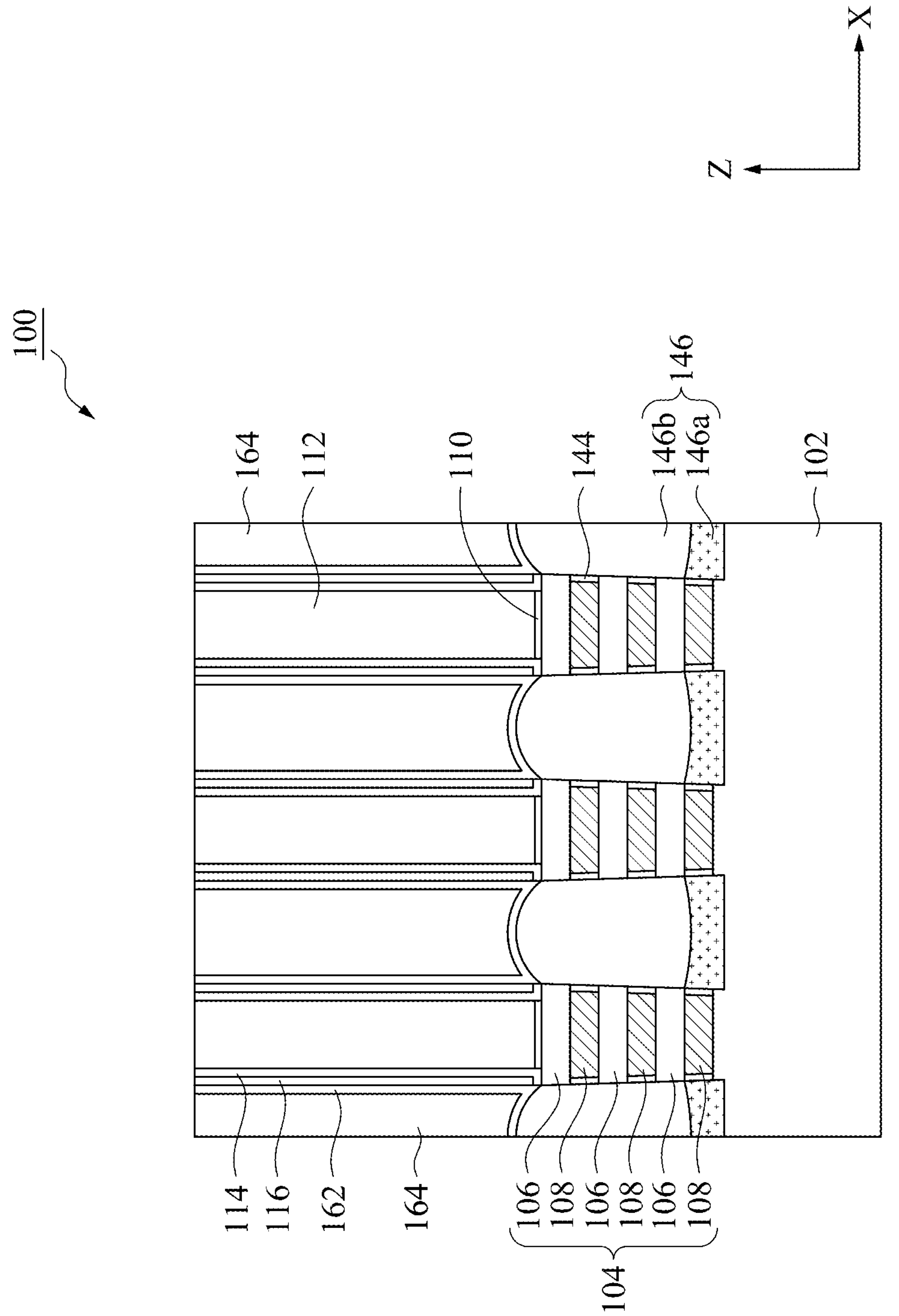
Figure 8B:
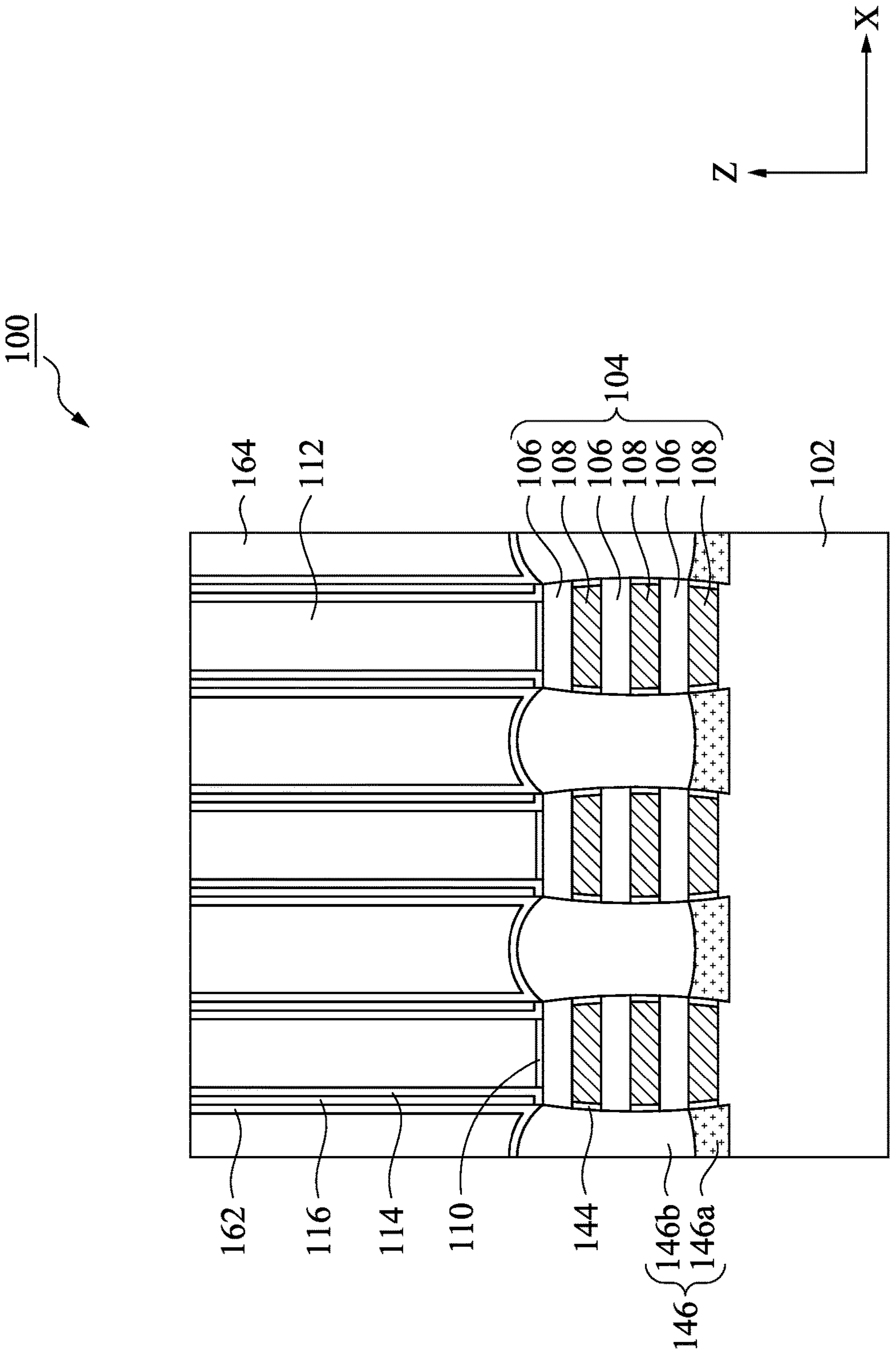
Figure 8C:
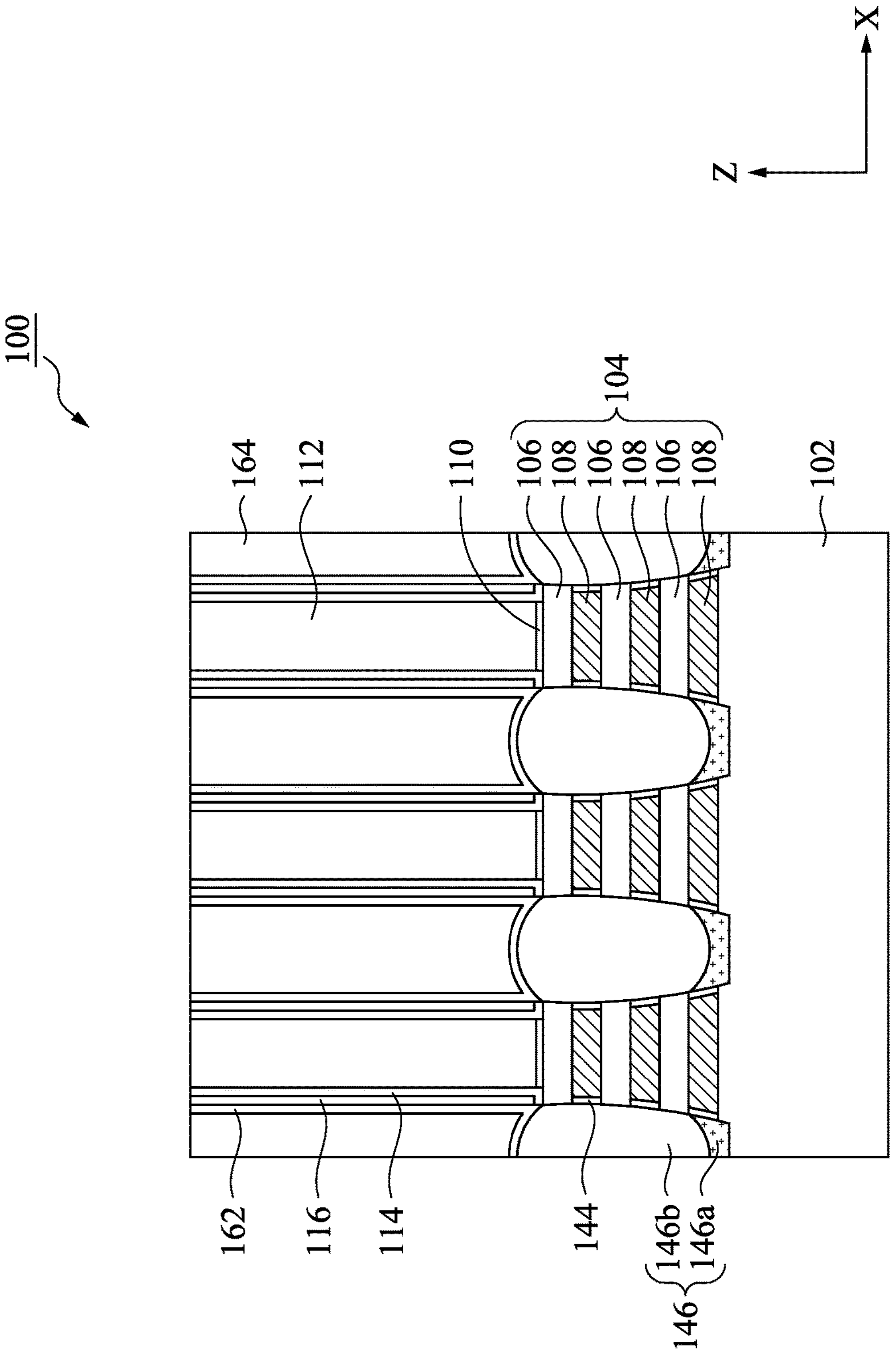

In FIGS. 8A-8C, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon and/or SiGe having lower germanium concentration than the second semiconductor layers 108, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form inner spacers 144. The inner spacers 144 may be made of SiON, SiCN, SiOC, SiOCN, or SiN. The inner spacers 144 may be formed by first forming a conformal dielectric layer using a conformal deposition process, such as ALD, followed by an anisotropic etching to remove portions of the conformal dielectric layer other than the inner spacers 144. The inner spacers 144 are protected by the first semiconductor layers 106 during the anisotropic etching process. The remaining second semiconductor layers 108 are capped between the dielectric spacers 144 along the X direction.

In FIGS. 8A-8C. S/D epitaxial features 146 are formed in the space defined for forming S/D regions between the neighboring stacks of semiconductor layers 104. FIGS. 8A-8C illustrate a manufacturing stage of the semiconductor device structure 100 based on the embodiments shown in FIGS. 5A-5C, respectively. The S/D epitaxial features 146 may be formed by any suitable process, such as cyclic deposition etch (CDE) epitaxy process, selective etch growth (SEG) process, ALD, molecular beam epitaxy (MBE), or any combination thereof. One of the pair of the S/D epitaxial features 146 may be a source region located at one side of the stack of semiconductor layers 104 and the other one of the pair of the S/D epitaxial features 146 may be a drain region located at the other side of the stack of semiconductor layers 104. A pair of S/D epitaxial features 146 includes a source epitaxial feature 146 and a drain epitaxial feature 146 connected by the channels that will be formed from the first semiconductor layers 106 subsequently. In this disclosure, a source and a drain are interchangeably used, and the structures thereof are substantially the same.

Each of the epitaxial features 146 may include multiple layers or portions formed from the bottom to the top of the spaces for forming the S/D regions. In some embodiments, the epitaxial features 146 may include a first epitaxial layer 146*a* formed on the exposed portion of the substrate 102, and a second epitaxial layer 146*b* formed on the first epitaxial layer 146*a*. The first epitaxial layer 146*a* may include a semiconductor material such as Si, SiP, SiC, SiAs, SiCP SiGe, or Ge. In some embodiments, the first epitaxial layer 146*a* is formed of undoped silicon. In some embodiments, the first epitaxial layer 146*a* is formed of undoped silicon germanium. That is, the first epitaxial layer 146*a* does not include a dopant. The first epitaxial layer 146*a* having no dopant avoids possible dopant diffusion into the regions of the substrate 102 located below the sacrificial gate structure 112 and between adjacent epitaxial S/D features 146.

Optionally, a middle epitaxial layer (not shown) may be conformally formed on the first epitaxial layer 146*a* and in contact with the first semiconductor layers 106 and the dielectric spacers 144. In some embodiments, the middle epitaxial layer may include the same material as the first epitaxial layer with a higher dopant concentration. In some embodiments, the middle epitaxial layer is formed of silicon germanium, and the Ge concentration is in a range between about 25% and 40%. Depending on the conductivity type of the device to be formed thereon, the middle epitaxial layer may have n-type dopants or p-type dopants. The middle epitaxial layer serves as a leakage barrier layer to prevent possible diffusion of subsequent backside metallic elements into the gate area. The middle epitaxial layer may also function as lattice transitional layer between the first epitaxial layer 146*a* and the second epitaxial layer 146*b*. In some embodiments, the middle epitaxial layer is a boron-rich layer. In such cases, the middle epitaxial layer contains boron and the dopant concentration is in a range between about 1E20 atoms/$cm^3$ and about 8E20 atoms/$cm^3$. In some embodiments, the middle epitaxial layer contains phosphorus and the dopant concentration is in a range between about 1E20 atoms/$cm^3$ and about 5E20 atoms/$cm^3$.

The second epitaxial layer 146*b* is formed on the first epitaxial layer 146*a* (or the middle epitaxial layer, if used) and has at least sidewalls surrounded by the first epitaxial layer 146*a*. In some embodiments, at least three surfaces of the second epitaxial layer 146*b* are in contact with the first epitaxial layer 146*a*. The second epitaxial layer 146*b* forms a major portion of the epitaxial S/D feature 146. Similarly, the second epitaxial layer 146*b* may be a semiconductor material, such as Si, SiP, SiC, SiAs, SiCP, SiGe, or Ge. In some embodiments, the second epitaxial layer 146*b* may include the same material as the first epitaxial layer 146*a*. In some embodiments, the second epitaxial layer 146*b* is formed of silicon germanium, and the Ge concentration is in a range between about 50% and 60%. Depending on the conductivity type of the device to be formed thereon, the second epitaxial layer 146*b* may have n-type dopants or p-type dopants. In either case, the second epitaxial layer 146*b* has a dopant concentration higher than the dopant concentration of the first epitaxial layer 146*a*. The higher dopant concentration of the second epitaxial layer 146*b* can reduce contact resistance for the epitaxial S/D features and provide better conductivity with the subsequently formed source/drain metal contact to be formed in the subsequent process steps. In some embodiments, the second epitaxial layer 146*b* contains boron and the dopant concentration is in a range between about 8E20 atoms/$cm^3$ and about 3E21 atoms/$cm^3$. In some embodiments, the second epitaxial layer 146*b* contains phosphorus and the dopant concentration is in a range between about 5E20 atoms/$cm^3$ and about 4E21 atoms/$cm^3$.

After formation of the S/D epitaxial features 146, a contact etch stop layer (CESL) 162 is conformally formed on the exposed surfaces of the semiconductor device structure 100. The CESL 162 covers the exposed surfaces of the S/D epitaxial features 146 and the gate spacers 116. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The materials for the ILD layer 164 may include oxide formed with tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, Cz and/or H. The ILD layer 164 may be deposited by a PECVD process or other suitable deposition technique. In some embodiments, after formation of the ILD layer 164, the semiconductor device structure 100 may be subject to a thermal process to anneal the ILD layer 164. A planarization operation, such as CMP, is performed on the semiconductor device structure 100 to remove portions of the ILD layer 164, the CESL 162, and the mask layer (not shown) until the sacrificial gate structures 112 are exposed.

Figure 9A:
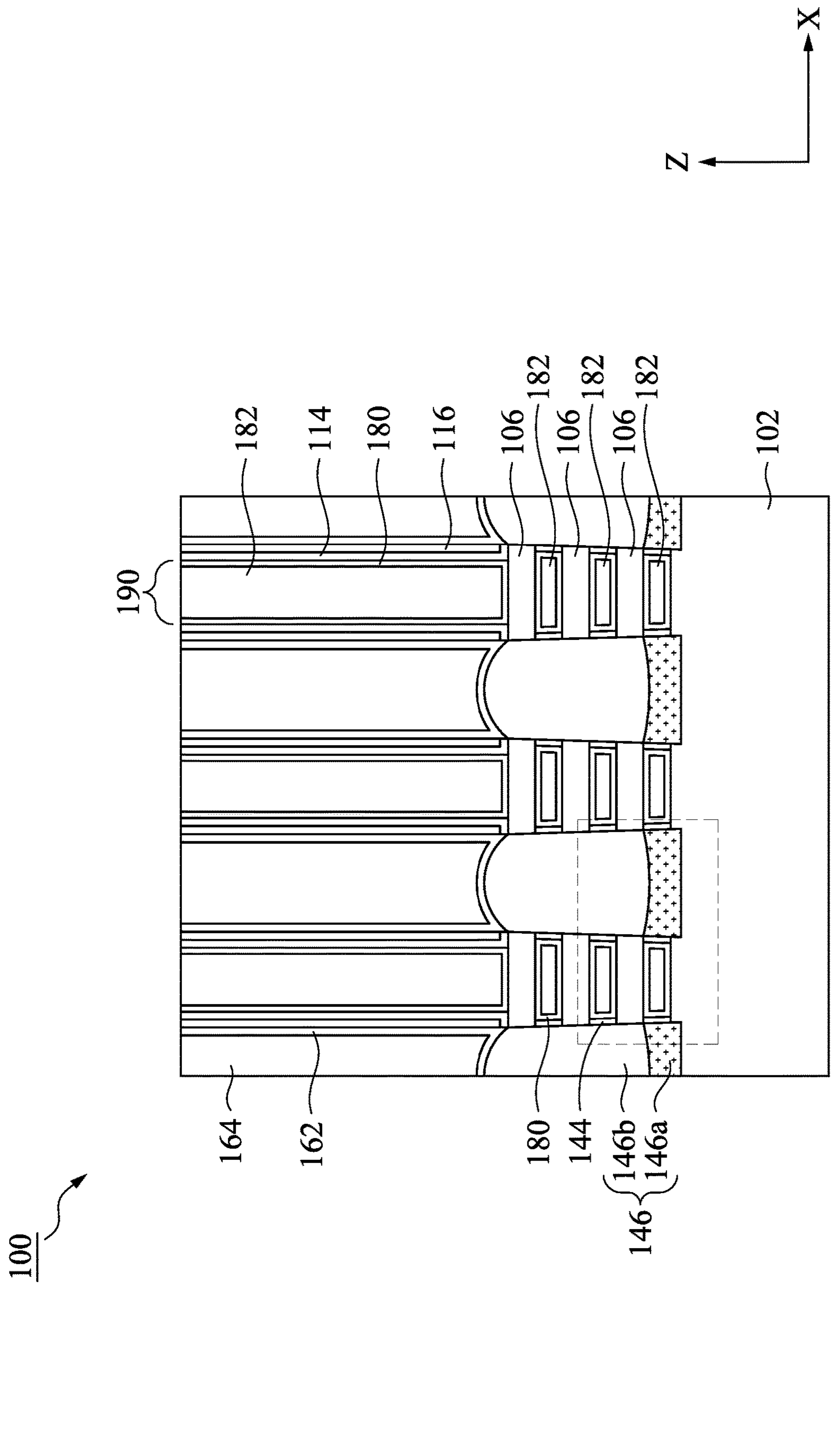
Figure 9B:
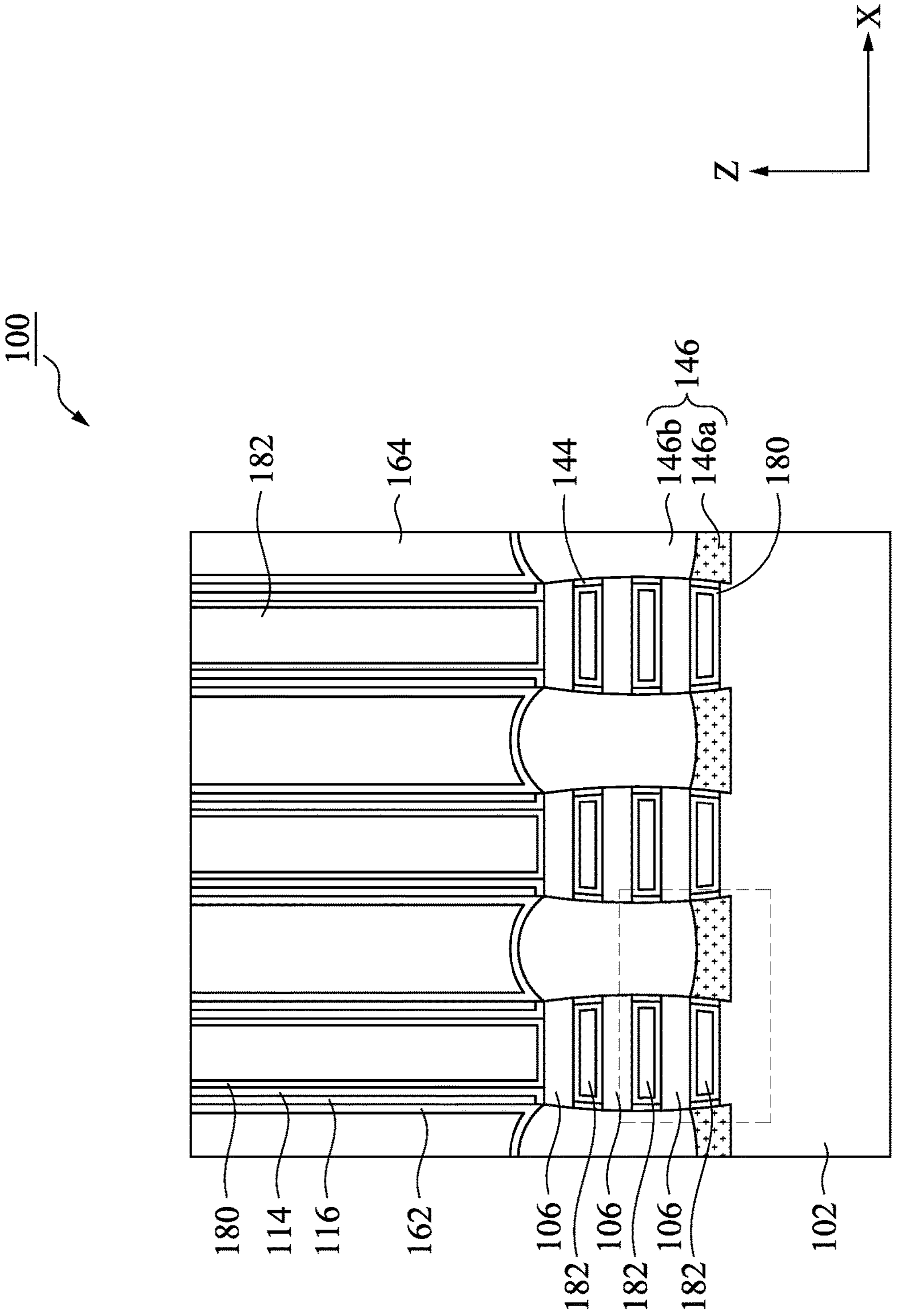
Figure 9C:
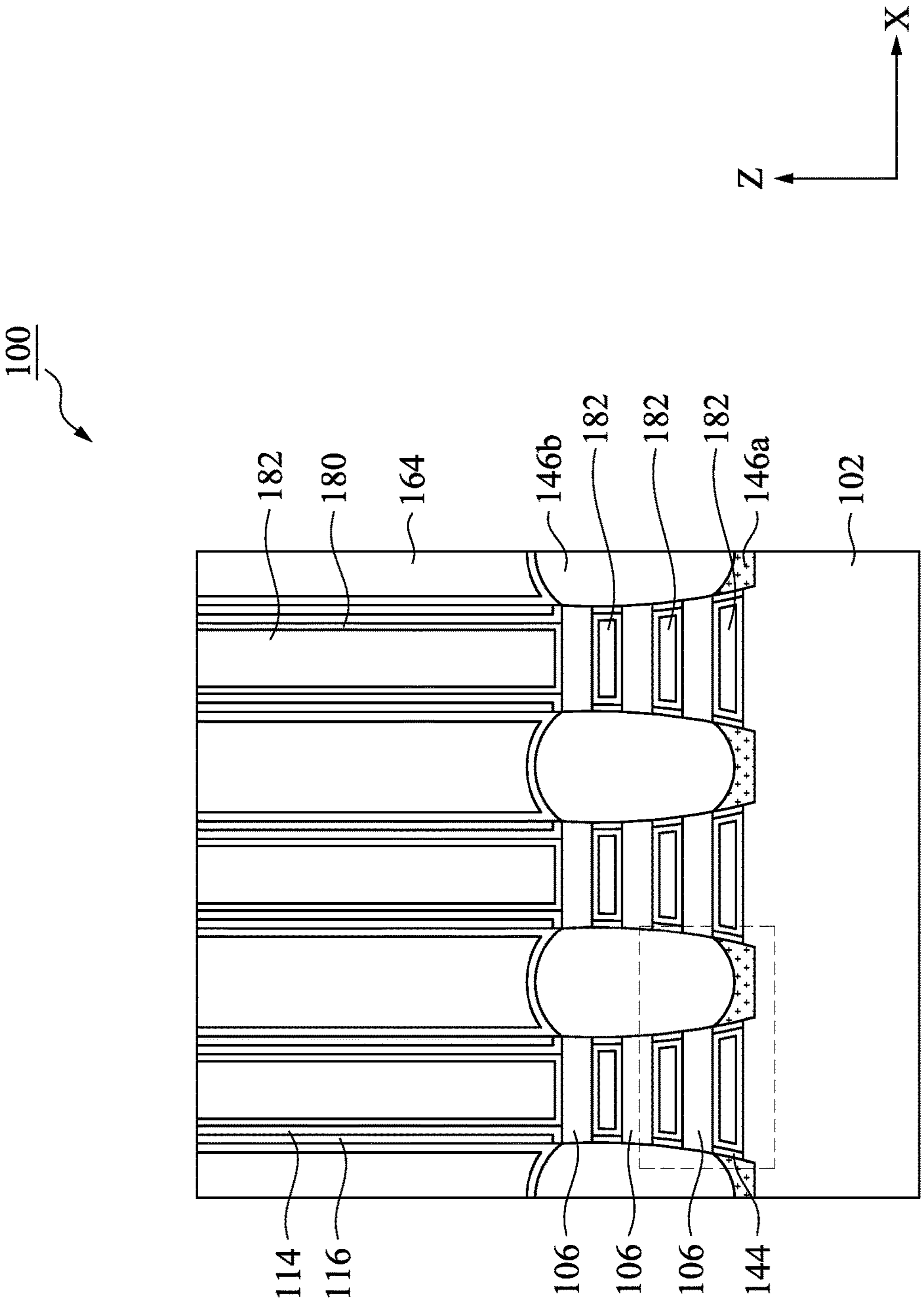

In FIG. 9A-9C, the sacrificial gate structure 112 and the second semiconductor layers 108 are removed. The sacrificial gate structures 112 may be removed using plasma dry etching and/or wet etching. The sacrificial gate structures 112 and the semiconductor layers 108 may be removed by any suitable process, such as dry etch, wet etch, or a combination thereof, followed by the removal of the etch stop layer 110, which may also be performed by any suitable process, such as dry etch, wet etch, or a combination thereof. In some embodiments, a wet etchant such as a tetramethylammonium hydroxide (TMAH) solution can be used to selectively remove the sacrificial gate structures 112 but not the gate spacers 114, the ILD layer 164, and the CESL 162.

The removal of the sacrificial gate structures 112 and the second semiconductor layers 108 exposes the inner spacers 144 and the first semiconductor layers 106 and forms openings between the gate spacers 116 and between the first semiconductor layers 106. The removal process may be any suitable etch processes, such as dry etch, wet etch, or a combination thereof. The etch process may be a selective etch process that removes the second semiconductor layers 108 but not the gate spacers 114 and 116, the ILD layer 164, the CESL 162, the inner spacers 144, and the first semiconductor layers 106.

After the sacrificial gate structures 112 and the second semiconductor layers 108, replacement gate structures 190 are formed. The replacement gate structures 190 each may include a gate dielectric layer 180 and a gate electrode layer 182. In some embodiments, an interfacial layer (IL) (not shown) may be formed on exposed surfaces of the first semiconductor layers 106. The IL may include or be made of an oxide (e.g., silicon oxide) formed by thermal or chemical oxidation of the first semiconductor layers 106, a nitride (e.g., silicon nitride, silicon oxynitride, oxynitride, etc.), and/or a dielectric layer (e.g., hafnium silicate). The IL may be formed by CVD, ALD, a clean process, or any suitable process. Next, the gate dielectric layer 180 is formed on the exposed surfaces of the semiconductor device structure 100 (e.g., on the IL (if present), sidewalls of the gate spacers 138, the top surfaces of the ILD layer 164, the CESL 162, and the dielectric spacers 144). The gate dielectric layer 180 may include or made of a high-k dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The gate dielectric layer 180 may be a conformal layer formed by a conformal process, such as an ALD process, a PECVD process, a molecular-beam deposition (MBD) process, or the like, or a combination thereof. The gate dielectric layer 180 may have a thickness in a range of about 0.3 nm to about 5 nm.

After formation of the gate dielectric layer 180, the gate electrode layer 182 is formed on the gate dielectric layer 180. The gate electrode layer 182 filles the openings formed by removal of the sacrificial gate structures 112 and the second semiconductor layers 108 and surrounds a portion of each of the first semiconductor layers 106. The gate electrode layer 182 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layers 182 may be formed by PVD, CVD, ALD, electroplating, or other suitable method. In some embodiments, one or more optional conformal layers (not shown) can be conformally (and sequentially, if more than one) deposited between the gate dielectric layer 180 and the gate electrode layer 182. The one or more optional conformal layers can include one or more barrier and/or capping layers and one or more work-function tuning layers. The one or more barrier and/or capping layers may include or be a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

Figure 10:
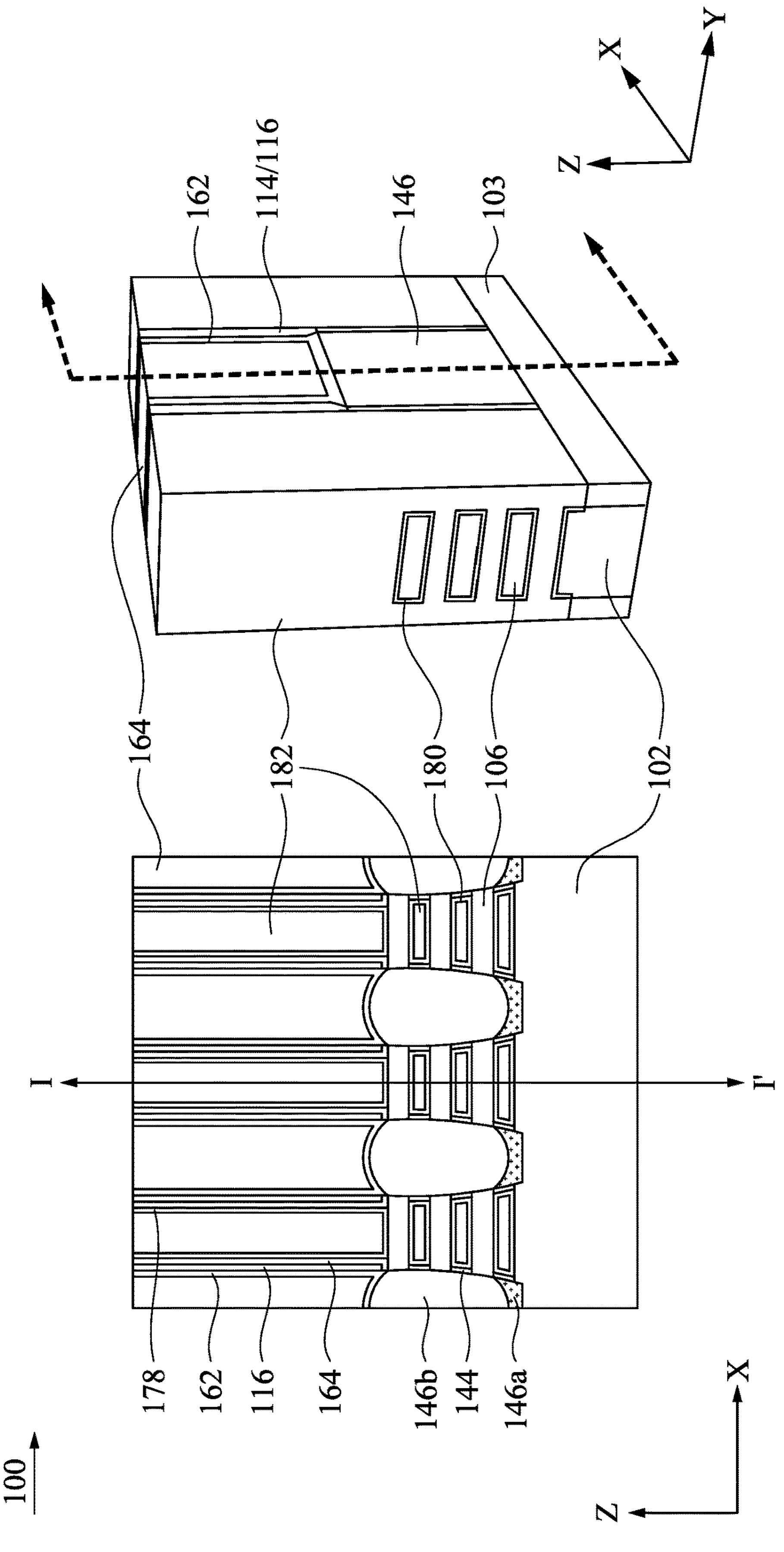
FIG. 10 shows a cross-sectional view of the semiconductor device structure as shown in FIG. 9C and a perspective view of a portion of the semiconductor device structure in accordance with some embodiments.

Portions of the gate electrode layer 182, one or more optional conformal layers (if any), and the gate dielectric layer 180 above the top surfaces of the ILD layer 164, the CESL 162, and the gate spacers 114/116 may be removed by a planarization process, such as by a CMP process. The resulting structure of the semiconductor device 100 can be referred to (a) the cross-sectional view on the x-z plane and (b) the perspective view of a block of the semiconductor device 100 cutting along the line I-I' in (a) towards the direction pointed by the arrows at the top and the bottom of portion (b) of FIG. 10. As shown in FIG. 10, the semiconductor device structure 10 may include shallow trench isolations STI 103 that have been formed in the substrate 102 prior to formation of various portions such as the channels, gates, S/D regions, and other features.

Figure 11A:
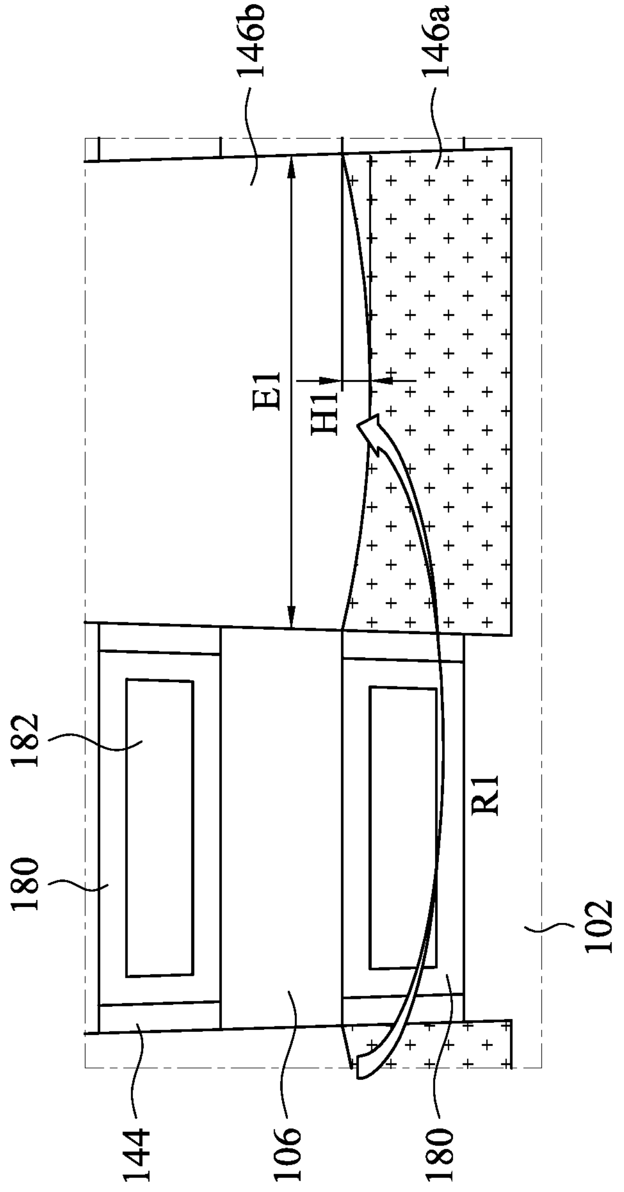
FIGS. 11A-11C are enlarged cross-sectional of a portion of the semiconductor device structure as shown in FIGS. 9A-9C, respectively.
Figure 11B:
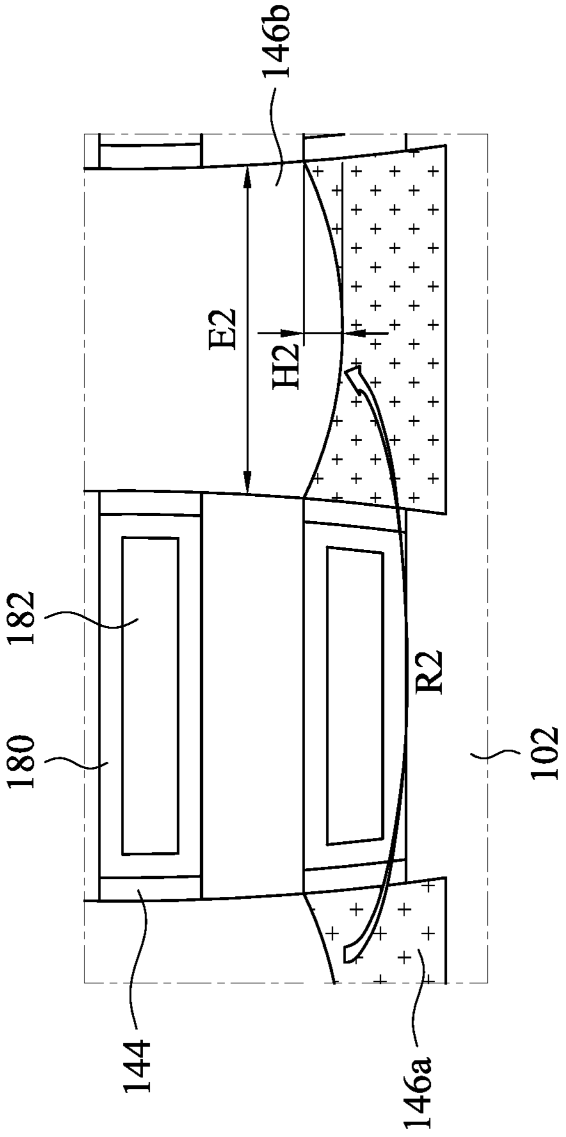
Figure 11C:
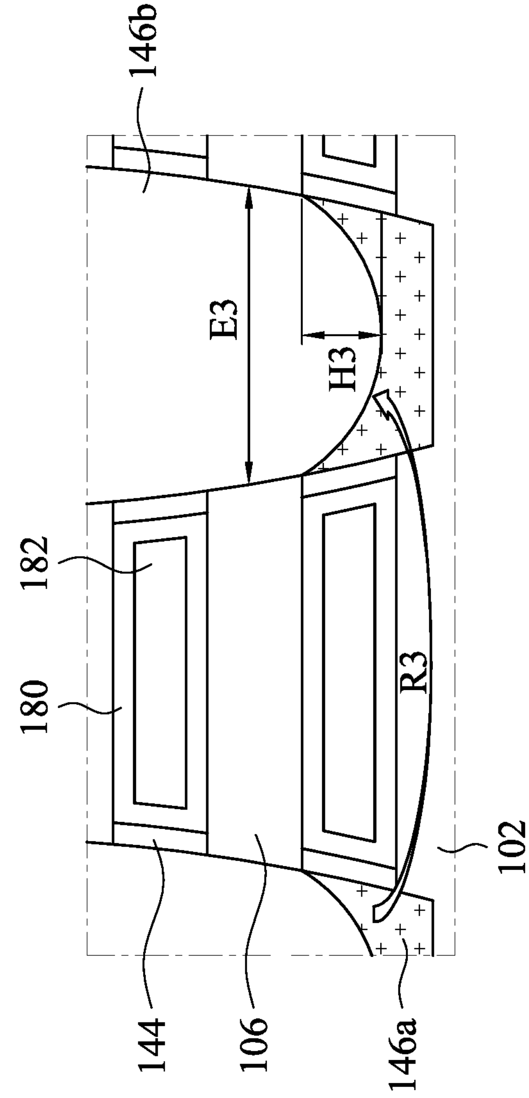

FIGS. 11A-11C are enlarged cross-sectional views of bottom portions of the semiconductor device 100 enclosed within the dash line as shown in FIGS. 9A-9C, respectively. The gradually narrowing S/D region 146 results in a notching profile as shown in FIG. 11A. The tapered profile, that is, gradually widening profile, of the stack of channels 106 as shown in FIG. 11C may be referred to as the foot profile. The epitaxy space, that is, the lateral space where the epitaxial features 146 may be grown between the neighboring pair of the channels 106 is denoted as E1, E2, E3 of the notching profile, the bowing profile, and the foot profile in FIGS. 11A to 11C, respectively, has the relation of E1>E2>E3. The maximum height of the epitaxial features 146 from the first epitaxial layer 146*a* to a level of the bottom side of the bottommost channel (i.e., first semiconductor layer 106) denoted as H1, H2, and H3 for the notching profile, the bowing profile, and the foot profile, respectively has the relationship of H1<H2<H3. In some embodiments, H1 ranges from about 3 nm to about 5 nm, H2 ranges from about 5 nm to about 10 nm, and H3 ranges from about 10 nm to about 20 nm. Based on the relationships of E1, E2, E3, H1, H2, and H3, the channel resistance $R_{ch}$ of the notching profile, the bowing profile, and the foot profile, denoted as R1, R2, and R3, respectively has the relationship of R1≥R2>R3.

Figure 12:
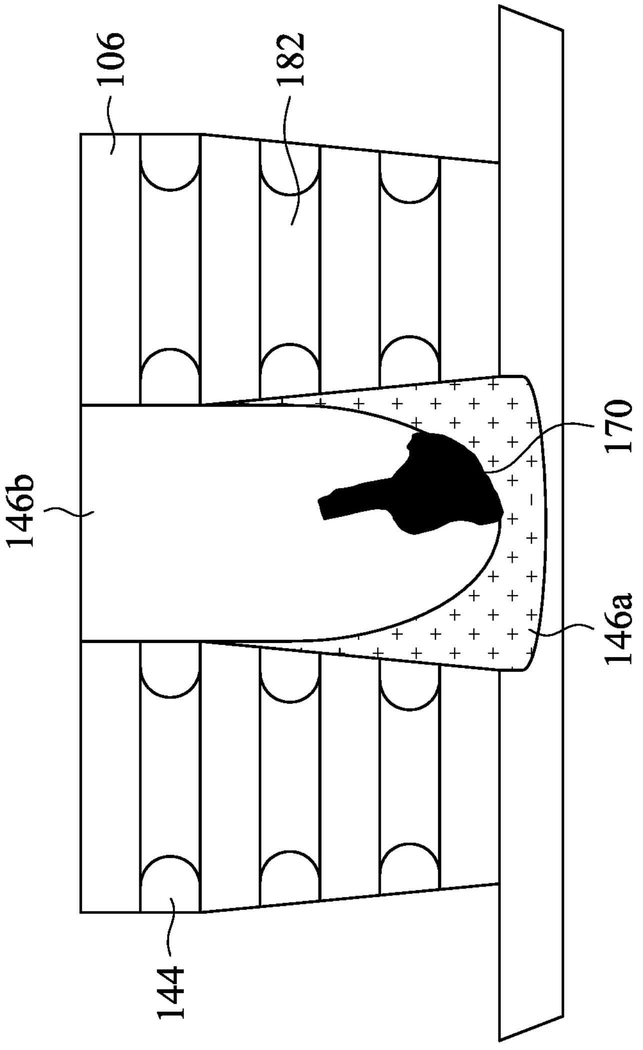
FIG. 12 shows an enlarged cross-sectional view of a portion of the semiconductor device structure as shown in FIG. 9A.

In addition to the longer epitaxy lengths E1, E2 and smaller heights H1, H2 that cause the channel resistance R1 and R2 to be higher, the narrower bottom portions of space for epitaxial growth may further increases the channel resistances R1 and R2 because of incomplete epitaxy growth. For example, the structure with the notching profile as shown in FIG. 9A has a narrower space at the upper portion for epitaxy growth than the space at the bottom portion. As the space to be filled with the second epitaxial layer 146*b* is smaller in the upper portion, the upper portion may be completely filled before the space at the bottom portion can be completely filled. That is, early merge may occur at the upper portion of the space and stop the epitaxial layer 146*b* to be continuously grown at the bottom portion of the space. As a result, voids 170 may be formed as shown in FIG. 12. The creation of the voids 170 may either break the connection between the neighboring channels or leads to a longer conductive path that extends along the voids to connect the neighboring channels. As the resistance is inversely proportional to the distance, the voids further increase the value of the channel resistance R1. The channel resistance R2 for the bowing profile may also be increased by the same issues. In contrast, the gradually narrowing profile towards the bottom as shown in FIG. 9C allows the narrower lower portion of the space to be merged or completely filled before the wider upper portion of the space could have been merged. Voids caused by early merge at the upper portion are prevented from being formed. As a result, the conductive path will not be lengthened to cause an increase of the channel resistance R3.

During the sheet formation (SHF), that is, formation of the channels, the semiconductor layers 108 made of SiGe are removed to create openings. The openings are then filled with metal such as material for forming the gate electrode layer 182 as shown in FIGS. 9A-9C, 10, and 11A-11C. As higher concentration of Ge in SiGe may result in easier lateral etch, to further assist the formation of the tapered or foot profile of the channel regions as shown in FIG. 11C, the bottom second semiconductor layer 108 may be formed with higher Ge concentration compared to those of the upper semiconductor layers 108. For example, the bottom second semiconductor layer 108 may has a Ge concentration of about 35% to about 45%, the middle second semiconductor layer 108 may have a Ge concentration of about 25% to about 35%, while the top semiconductor layer 108 may have a Ge concentration of about 15% to about 25%. The etching time at the upper portions is thus longer than that at the bottom portion.

According to one embodiment, a method of forming a nanosheet FET is provided. A plurality of first and second semiconductor layers are alternately formed on a substrate. The first and second semiconductor layers are patterned into a plurality of stacks of semiconductor layers separate from each other by a space along a direction. Each stack of semiconductor layers has a cross-sectional view along the direction gradually widening towards the substrate. An epitaxial feature is formed in each of the spaces. The patterned second semiconductor layers are then removed from each of the stacks of semiconductor layers. The method may further comprise patterning the stack of semiconductor layers using a plasma etch process. The patterning process may include an etch process with applications of a source power, a first bias power, and a second bias power at the same time.

In some embodiments, the source power is higher than the first bias power, and the first bias power is higher than the second bias power. The source power may be controlled at a first power level to create ions from an etching gas, the first bias power may be controlled at a second power level to push the ions downward with a first ion angle with respect to a horizontal line, and the second bias power may be controlled at a third power level to push the ions downward with a second ion angle with respect to the horizontal line. The first ion angle is about 70° to about 80° and the second ion angle is about 90°. To pattern the stack of semiconductor layers, an upper portion of the stack of semiconductor layers may be etched by a first pulsing scheme, and a lower portion of the stack of semiconductor layers may be etched by a second pulsing scheme different than the first pulsing scheme. The second pulsing scheme may comprise continuously applying the source power, the first bias power, and the second bias power without pumping out extra gas and byproducts.

In some embodiments, the method may further comprise forming a plurality of Si layers and a plurality of SiGe layers on the substrate to form the stack of semiconductor layers, wherein the SiGe layers have Ge concentrations gradually reduced from a bottom SiGe layer towards a top SiGe layer. A plurality of sacrificial gate structures may be formed on the first and second semiconductor layers before patterning the first and second semiconductor layers. A conformal spacer may be formed on a sidewall of each of the sacrificial gate structures. The stack of semiconductor layers exposed between the sacrificial gate structures may be removed by patterning the stack of semiconductor layers.

A method of forming void-free source/drain regions is provided according to some embodiment. The method includes etching a stack of semiconductor layers on a substrate to form a space exposing the substrate, forming a first epitaxial layer at a bottom of the space, and forming a second epitaxial layer over the first epitaxial layer in the space. The space has a cross-sectional profile that is gradually narrowing towards the substrate. The gradually narrowing profile of the space is performed by performing an etching process with a pulse scheme using a source power, a first bias power, and a second bias power simultaneously. The second bias power is smaller than the first bias power, and the first bias power is smaller than the source power. The source power has a first power level and a first frequency to create ions from an etching gas, the first bias power has a second power level and a second frequency to push the ions downward with a first ion angle with respect to a horizontal line, and the second bias power has a third power level and a third frequency to push the ions downward with a second ion angle with respect to the horizontal line. A step of continuously applying the source power, the first bias power, and the second bias power may also be performed without pumping out extra gas and byproducts during the etching process. In some embodiments, a plurality of Si layers and a plurality of SiGe layers are alternately formed on the substrate to form the stack of semiconductor layers. The SiGe layers have Ge concentrations gradually reduced from a bottom SiGe layer towards a top SiGe layer.

A semiconductor device structure is provided according to some embodiments, The structure includes a channel region, a first source/drain feature having a sidewall in contact with the first and second channel layers, a gate dielectric layer disposed to surround exposed surfaces of each of the first and second channel layers, and a gate electrode layer disposed on the gate dielectric layer. The channel region may include a first channel layer formed of a first material, wherein the first channel layer has a first width and a second channel layer formed of the first material and disposed below the first channel layer, wherein the second channel layer has a second width greater than the first width. According to some embodiments, the structure may further include a third channel layer formed of the first material below the second channel layer, wherein the third channel layer has a third width greater than the second width. In some embodiment, the channel region further comprises a plurality of additional channel layers formed of the first material below the second channel layers, wherein the additional channel layers have widths gradually decreased from the second width. The source/drain feature may have a gradually narrower profile from a top level of the first channel layer to a bottom level of the second channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

alternately forming a plurality of first and second semiconductor layers on a substrate;

patterning the alternately formed first and second semiconductor layers into a plurality of stacks of semiconductor layers, the plurality of stacks being separate from each other by a space along a direction, and each of the stacks of semiconductor layers having a cross-sectional profile along the direction gradually widening towards the substrate;

forming an epitaxial feature in each of the spaces; and removing the patterned second semiconductor layers from each of the stacks of semiconductor layers, wherein patterning the stack of semiconductor layer is performed by an etch process using a source power, and at least one of a first bias power and a second bias power at the same time.

2. The method of claim 1, further comprising patterning the stack of semiconductor layers using an anisotropic plasma etch process.

3. The method of claim 1, wherein patterning the stack of semiconductor layers is performed by an etch process using the source power, the first bias power, and the second bias power at the same time.

4. The method of claim 1, wherein the source power is higher than the first bias power, and the first bias power is higher than the second bias power.

5. The method of claim 1, wherein the source power is controlled at a first power level to create ions from an etching gas, the first bias power is controlled at a second power level to push the ions downward with a first ion angle with respect to a horizontal line, and the second bias power is controlled at a third power level to push the ions downward with a second ion angle with respect to the horizontal line.

6. The method of claim 5, wherein the first ion angle is about 70° to about 80° and the second ion angle is about 90°.

7. The method of claim 1, wherein patterning the stack of semiconductor layers further comprising:

removing an upper portion of the stack of semiconductor layers by a first pulsing scheme; and removing a lower portion of the stack of semiconductor layers by a second pulsing scheme different than the first pulsing scheme.

8. The method of claim 7, wherein the second pulsing scheme comprises continuously applying the source power, the first bias power, and the second bias power without pumping out extra gas and byproducts.

9. The method of claim 1, further comprising alternately forming a plurality of Si layers and a plurality of SiGe layers on the substrate to form the stack of semiconductor layers, wherein the SiGe layers have Ge concentrations gradually reduced from a bottom SiGe layer towards a top SiGe layer.

10. The method of claim 1, further comprising:

forming a plurality of sacrificial gate structures on the first and second semiconductor layers before patterning the first and second semiconductor layers;

forming a conformal spacer on a sidewall of each of the sacrificial gate structures; and removing the stack of semiconductor layers exposed between the sacrificial gate structures by patterning the stack of semiconductor layers.

11. A method of forming void-free source/drain regions, comprising:

etching a stack of semiconductor layers on a substrate to form a space exposing the substrate, wherein the space has a cross-sectional profile that is gradually narrowing towards the substrate, wherein the etching process is performed with a pulse scheme using a source power, and one of a first bias power and a second bias power simultaneously;

forming a first epitaxial layer at a bottom of the space; and forming a second epitaxial layer over the first epitaxial layer in the space.

12. The method of claim 11, wherein the gradually narrowing profile of the space is performed by performing the etching process with the pulse scheme using the source power, the first bias power, and the second bias power simultaneously.

13. The method of claim 12, wherein the second bias power is smaller than the first bias power, and the first bias power is smaller than the source power.

14. The method of claim 13, wherein the source power has a first power level and a first frequency to create ions from an etching gas, the first bias power has a second power level and a second frequency to push the ions downward with a first ion angle with respect to a horizontal line, and the second bias power has a third power level and a third frequency to push the ions downward with a second ion angle with respect to the horizontal line.

15. The method of claim 14, further comprising continuously applying the source power, the first bias power, and the second bias power without pumping out extra gas and byproducts during the etching process.

16. The method of claim 15, further comprising alternately forming a plurality of Si layers and a plurality of SiGe layers on the substrate to form the stack of semiconductor layers, wherein the SiGe layers have Ge concentrations gradually reduced from a bottom SiGe layer towards a top SiGe layer.

17. A semiconductor device structure, comprising:

a channel region, comprising:

a first channel layer formed of a first material, wherein the first channel layer has a first width;

a second channel layer formed of the first material and disposed below the first channel layer, wherein the second channel layer has a second width greater than the first width; and a plurality of additional channel lavers formed of the first material below the second channel layers, wherein the additional channel layers have widths gradually decreased from the second width;

a first source/drain feature having a sidewall in contact with the first and second channel layers;

a gate dielectric layer disposed to surround exposed surfaces of each of the first and second channel layers; and a gate electrode layer disposed on the gate dielectric layer.

18. The semiconductor device structure of claim 17, further comprising a third channel layer formed of the first material below the second channel layer, wherein the third channel layer has a third width greater than the second width.

19. The semiconductor device structure of claim 18, wherein the source/drain feature has a gradually narrower profile from a top level of the first channel layer to a bottom level of the second channel layer.

20. The semiconductor device of claim 17, wherein the widths of the channel layers are formed using a pulse scheme using a source power, and one of a first bias power and a second bias power.

* * * * *